United States Patent [19]
Uchino et al.

[11] Patent Number: 5,915,162
[45] Date of Patent: *Jun. 22, 1999

[54] COATED CUTTING TOOL AND A PROCESS FOR THE PRODUCTION OF THE SAME

[75] Inventors: Katsuya Uchino; Toshio Nomura; Hisanori Ohara; Masuo Chudo; Mitsunori Kobayashi, all of Itami, Japan

[73] Assignee: Sumitomo Electric Industries, Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/379,624
[22] PCT Filed: May 31, 1994
[86] PCT No.: PCT/JP94/00882
§ 371 Date: Mar. 9, 1995
§ 102(e) Date: Mar. 9, 1995
[87] PCT Pub. No.: WO94/28191
PCT Pub. Date: Dec. 8, 1994

[30] Foreign Application Priority Data

| May 31, 1993 | [JP] | Japan | 5-128713 |
| Aug. 9, 1993 | [JP] | Japan | 5-197240 |
| Apr. 20, 1994 | [JP] | Japan | 6-081445 |
| May 25, 1994 | [JP] | Japan | 6-110811 |

[51] Int. Cl.[6] .................................................. B22F 3/00
[52] U.S. Cl. ......................... 428/551; 428/627; 428/698; 428/699; 75/235
[58] Field of Search .................................. 428/552, 565, 428/617, 623, 627, 701, 702, 704, 911, 698, 699; 75/235, 238, 240, 244; 76/DIG. 11; 51/297, 307, 309

[56] References Cited

U.S. PATENT DOCUMENTS

| 3,656,995 | 4/1972 | Reedy, Jr. | 117/69 |
| 3,771,976 | 11/1973 | Wakefield | 29/194 |
| 4,150,195 | 4/1979 | Tobioka et al. | 428/548 |
| 4,282,289 | 8/1981 | Kullander et al. | 428/457 |
| 4,693,944 | 9/1987 | Sugisawa et al. | 428/698 |
| 4,812,370 | 3/1989 | Okada et al. | 428/552 |
| 4,966,501 | 10/1990 | Nomura et al. | 407/119 |
| 4,984,940 | 1/1991 | Bryant et al. | 407/119 |
| 5,075,181 | 12/1991 | Quinto et al. | 428/698 |
| 5,250,367 | 10/1993 | Santhanam et al. | 428/698 |
| 5,296,016 | 3/1994 | Yoshimura et al. | 75/238 |
| 5,372,873 | 12/1994 | Yoshimura et al. | 428/216 |
| 5,374,471 | 12/1994 | Yoshimura et al. | 428/216 |
| 5,436,071 | 7/1995 | Odani et al. | 428/336 |
| 5,487,625 | 1/1996 | Ljungberg et al. | 407/119 |

FOREIGN PATENT DOCUMENTS

| 0 191 554 | 8/1986 | European Pat. Off. |
| 0 440 157 | 8/1991 | European Pat. Off. |
| 440157 | 8/1991 | European Pat. Off. |
| 89 10 041 | 10/1989 | Germany |
| 60-77972 | 5/1985 | Japan |
| 3-190604 | 8/1991 | Japan |
| 4-13874 | 1/1992 | Japan |

*Primary Examiner*—Kathryn Gorgos
*Assistant Examiner*—Thomas H. Parsons
*Attorney, Agent, or Firm*—Wenderoth, Lind & Ponack, L.L.P.

[57] ABSTRACT

This invention relates to a coated cutting tool suitable for high speed cutting working and a process for the production of the same. The feature of the present invention consists in a coated cutting tool comprising a coating layer consisting of an inner layer and outer layer on a surface of a substrate consisting of a cemented carbide such as tungsten carbide-based cemented carbide, etc., the inner layer being composed of a mono-layer of titanium carbonitride in contact with the substrate, a double layer of titanium nitride of 0.1 to 2 $\mu$m in thickness, in contact with the substrate, and titanium carbonitride directly above it or a multi-layer provided thereon consisting of titanium carbide, etc., in which the chlorine content in the inner layer is at most 0.05 atom % on average throughout the inner layer, the ratio of the peak intensities of the specified planes in the X-ray diffraction of the above described titanium carbonitride in the specified range and as the inner layer, there are provided coating layers consisting of a first layer of titanium nitride in contact with the substrate and a second layer having a hardness of 160 to 2400 kg/mm$^2$, and a process for the production of the same. The coated cutting tool of the present invention exhibits a high wear resistance of the coating itself, tenacious adhesiveness of the coating film and substrate and excellent stripping resistance during cutting.

11 Claims, No Drawings

COATED CUTTING TOOL AND A PROCESS FOR THE PRODUCTION OF THE SAME

This is a National Stage Application of PCT JP4/00882 filed on May 31, 1994.

TECHNICAL FIELD

This invention relates to a coated cutting tool having a tenacious and high wear resistance coating formed on the surface of a substrate such as cemented carbides and a process for the production of the same.

BACKGROUND TECHNIQUE

Improvement of the service life of a cutting tool has been carried out by vapor deposition of a coating layer of titanium carbide (TiC) on a surface of cemented carbides, cermets or ceramics and in general, a coated cutting tool having a coating layer formed by a thermal or heat-assisted chemical vapor deposition method (hereinafter referred to as heat-assisted CVD method) or plasma CVD method has widely been spread.

However, in the case of carrying out a working using these coated cutting tools, for example, working which requires wear resistance of the coating layer at high temperatures, such as high speed cutting, and a working requiring a number of workings and a number of thrusting-in workpieces, such as the working of small-sized parts, results in a decrease in service life of the tool resulting from the poor wear resistance of the coating layer or damaging of the coating layer.

In the coating film by the heat-assisted CVD method, the adhesiveness thereof to a substrate is excellent, and depending upon the variety of the substrates, the η phase as a brittle layer tends to be deposited thick on the interface with the substrate, in particular, near the cutting edge ridge line. During cutting, the coating layer falls away with this η phase to promote wearing of the tool and a reduction in the service life of the tool. Thus, the presence of the coating layer does not necessarily result in the improvement in the wear of the tool.

In these coated cutting tools, factors affecting the wear resistance and peeling resistance are the chlorine content in components for forming the coating layer, and the preferred orientation.

Coating of titanium carbide or titanium nitride (TiN) by the heat-assisted CVD method is generally carried out by the use of titanium tetrachloride ($TiCL_4$) as a titanium source, methane ($CH_4$) as a carbon source and nitrogen gas as a nitrogen source. Thus, in the coating using these gases, chlorine resulting from the titanium tetrachloride is taken in the coating layer, resulting in deterioration of the film quality.

As a report as to the chlorine in the film, there are disclosed techniques in which coating is carried out at a low temperature side using a plasma CVD method, for example, in "Hyomen Gijitsu (Surface Techniques)" Vol. 40, No. 10, 1889, p 51–55, "Hyomen Gijitsu" Vol. 40, No. 4, 1889, p 33–36, etc. This report tells that the level of the chlorine content in the film can be reduced to about 1 atom % by film making by the plasma CVD method at a temperature of up to 700° C., whereby good film quality can be obtained.

Japanese Patent Laid-Open Publication. No. 13874/1992 describes that a titanium carbide film with excellent film adhesiveness as well as good wear resistance is composed of two titanium coating layers consisting of one having a chlorine content of 0.025 to 0.055 atom % up to a thickness of less than 0.5 μm from the surface of a substrate and the other having a chlorine content of 0.055 to 1.1 atom % at a thickness of at least 0.5 μm therefrom. In the method described in this publication, since titanium tetrachloride is used as a raw material gas and free carbon (C) from methane is used as a carbon source, the chlorine (Cl) from the titanium tetrachloride and the free carbon from the methane are taken in the film, thus unfavourably affecting the property of the film. In particular, precipitation of C in the film lowers the wear resistance, which should preferably be avoided, but the presence of chlorine in a proportion of at least 0.055 atom % suppresses the precipitation of C to give a titanium carbide film excellent in wear resistance without depositing carbon. According to this method, therefore, it is required that the chlorine content is adjusted to 0.025 to 0.055 atom % near the substrate interface and to at least 0.055 atom % far from the interface so as to increase the adhesiveness. In this case, moreover, the presence of chlorine itself causes lowering of the wear resistance, so the wear resistance of the resulting film cannot be said to be sufficient.

When an intermittent working or parts working is carried out using a coated cutting tool provided with a coating layer by a heat-assisted CVD method, up to the present time, there have occurred separation of a substrate and a film and breakage of a film itself, whereby exposure or breakage of the substrate has often been caused, and as one of the causes of breakage of the film itself, the preferred orientation of the coating layer is considered. Ordinarily, it is known that a coating layer of titanium carbide, etc. by the heat-assisted CVD method is strongly orientated to (220) plane ["Nippon Kinzoku Gakkai-shi (Journal of Japanese Metallurgical Society)" Vol. 41, No. 6, 1977, p 542–545], but in the titanium carbide, etc. having the rock salt type structure, (220) plane is a primary slip plane at a temperature of at most about 600° C. corresponding to the edge temperature of a cutting edge in such a working, and breaking tends to occur towards the direction of this plane. In addition, in the vicinity of the interface with the substrate, such a large tensile residual stress due to difference in thermal expansion coefficient between the substrate and coating layer is applied to the coating layer that when the cutting tool is rubbed in a parallel direction to the film surface by a workpiece or chips during working and a shearing stress is thus applied to the film, the film is considered to be breakable in the vicinity of the interface with the substrate.

As a means for solving the above described problem on the η phase, a process for forming a titanium carbonitride film by a heat-assisted CVD method using an organo CN compound such as acetonitrile ($CH_3CN$), etc. has been watched with keen interest (Japanese Patent Laid-Open Publication No. 117809/1975, Japanese Patent Laid-Open Publication No. 109828/1975, etc.)

According to this process, coating is rendered possible at a lower temperature as compared with the heat-assisted CVD method, so this is generally called "medium temperature CVD method (MT-CVD method)". In the prior art heat-assisted CVD method (high temperature CVD method; called "HT-CVD method"), elements, in particular, carbon is transferred to the film from the substrate during forming a titanium-containing film to form a modified layer (composite carbides such as $Co_3W_3C$, etc. called η phase). The transfer of elements in the HT-CVD method as described above is probably due to that the coating temperature is higher (ordinarily 1000 to 1050° C.). As to the transfer of carbon, in particular, it is considered, in addition to the high temperature, that such a phenomenon takes place, for example, that a concentration gradient of carbon is formed between the substrate surface and film during being formed because of insufficient supply of carbon from the gaseous phase during forming the film and the film absorbs carbon from the substrate.

In the MT-CVD method, on the other hand, it is considered that no η phase is formed even at the interface of the cutting edge ridge line part, because the coating temperature is somewhat lower (800 to 900° C.) and supply of C and N from the gaseous phase is sufficient.

Since then, a number of patent applications have been filed employing the MT-CVD method. For example, Japanese Patent Laid-Open Publication Nos. 64469/1991 and 87368/1991 have respectively proposed a tool obtained by directly forming a titanium carbonitride (TiCN) film on a surface of a cemented carbide substrate by the MT-CVD method and forming a multi-layer film of alumina ($Al_2O_3$) or titanium nitride (TiN) by the HT-CVD method. In Japanese Patent Laid-Open Publication Nos. 99467/1987, there are disclosed a single layer or laminated layer film consisting of a titanium carbonitride film and/or titanium nitride film each having a crystalline grain diameter of at most 0.5 $\mu$m, coated with a thickness of 0.5 to 5.0 $\mu$m, and a process comprising forming a titanium carbonitride film by the MT-CVD method at a vapor deposition temperature of 700 to 900° C. In this process, however, the film in contact with a substrate is a titanium carbonitride film (TiCN).

While the inventors have been making studies on a cemented carbide substrate coated with a titanium carbonitride film, it is found that the adhesiveness of the titanium carbonitride film by the MT-CVD method to the cemented carbide substrate often becomes unstable. Thus, the inventors have made analysis of this phenomenon and consequently, have found that this is caused by etching of cobalt (Co) as a binder phase on the surface of the cemented carbide substrate with chlorine gas formed as a reaction product during forming the titanium carbonitride film by the MT-CVD method.

The thermal decomposition of an organo CN compound such as acetonitrile is susceptible to the chemical bonded state of the substrate surface and often lead to formation of free carbon. The thus formed free carbon lowers the adhesiveness of the film and substrate and renders unstable the property of the coated cutting tool by the MT-CVD method in combination with the foregoing formation of the interface modified layer.

Japanese Patent Laid-Open Publication Nos. 170559/1986 discloses a surface-coated cemented carbide comprising a cemented carbide substrate the surface of which is coated with a multi-layer of titanium carbide, titanium nitride and titanium carbonitride, the innermost layer in contact with the substrate consisting of titanium nitride with a thickness of 0.1 to 1.0 $\mu$m. This is related with a coating by a PVD method and is silent as to the effects of the chlorine content in the film and the preferred orientation of the crystal.

As to the hardness of the film, it is generally considered that the higher the hardness, the more excellent the wear resistance, but there arises a problem that when only the hardness of the film is high, the toughness of the film is lowered to be brittle and in the case of a cutting tool, it tends to meet with abnormal wear and cannot practically be used. Accordingly, it has been required to balance the hardness and toughness properties.

As to the micro structure of the film, it has been proposed, as described in Japanese Patent Laid-Open Publication Nos. 99467/1987, that a titanium carbonitride and/or titanium nitride film having a crystal grain diameter of at most 0.5 $\mu$m is most suitable for making up a coating layer, but this proposal is not practical because of no description of an assessment method regarding the shape of the crystal grain and grain diameter.

It is an object of the present invention to provide a coated cutting tool with a higher wear resistance, more tenacious adhesiveness of a coating film and substrate and more excellent peeling or stripping resistance during cutting as compared with coated cutting tools of the prior art, and a process for the production of the same, whereby the foregoing problems in the prior art can be solved.

Furthermore, it is another object of the present invention to provide a coated cutting tool with higher reliability than cutting tools of the prior art, whereby the advantages of the titanium carbonitride film by the MT-CVD method can be given to the maximum extent.

In order to achieve these objects, the present invention provides a coated cutting tool having a film structure capable of preventing the surface of a substrate from modification during forming the coating and inhibiting deposition of an unfavourable material on the interface between the film and substrate, and provides a coated cutting tool having not only a macro film structure optimized but also a structure optimized from the standpoint of the microscopic structure and the hardness, and a mechanical strength in an optimum range.

DISCLOSURE OF THE INVENTION

The inventors have made various efforts to solve the above described problems in a coated cutting tool having a coating layer comprising an innermost layer in contact with a substrate consisting of titanium carbonitride or a titanium nitride layer in contact with the substrate and titanium carbonitride directly above the titanium nitride layer and consequently, have found that the chlorine content in components composing the coating layer, in particular, the titanium carbonitride in contact with the substrate or the titanium nitride in contact with the substrate and titanium carbonitride directly above it is adjusted to at most a specified amount, or the preferred orientation of the titanium carbonitride is maintained in a specified range, whereby the wear resistance of the cutting tool during cutting can more be improved than that of the coated cutting tools of the prior art, improvement of the wear resistance of the film itself and breakage strength of the film is rendered possible and the service life of the tool is rendered stable and largely lengthened. The present invention is based on this finding.

Furthermore, the inventors have made various studies to solve the above described problems and consequently, have found that it is effective for solving the problems not to directly coat a surface of a substrate with a titanium carbonitride by the MT-CVD method, but to first coat a surface of a substrate with titanium nitride as a first layer and then coat thereon a titanium carbonitride layer as a second layer.

It is further found that the film property of the titanium carbonitride film as a second layer is largely affected by the micro hardness, crystalline structure, grain size, etc. thereof.

The present invention has been accomplished by these findings and knowledges.

First, the present invention provides a coated cutting tool comprising an inner layer and an outer layer on a surface of a substrate consisting of tungsten carbide-based cemented carbide, titanium carbonitride-based cermet, silicon nitride-based ceramics or aluminum oxide-based ceramics, the inner layer being composed of a mono-layer of titanium carbonitride in contact with the substrate, a double layer of titanium nitride of 0.1 to 2 μm in thickness, in contact with the substrate, and titanium carbonitride directly above it or a multi-layer consisting of at least one coating selected from the group consisting of carbides, nitrides, carbonitrides, boronitrides and borocarbonitrides of titanium on the titanium carbonitride of the mono-layer or double layer and the outer layer being composed of a mono-layer or multi-layer consisting of at least one member selected from the group consisting of aluminum oxide, zirconium oxide, hafnium oxide, titanium carbide, titanium carbonitride and titanium nitride, which has any one of the following constructions (1) to (13):

(1) a coated cutting tool characterized in that the chlorine content in the above described inner layer is at most 0.05 atom % on average throughout the inner layer, (2) a coated cutting tool of (1) characterized in that the chlorine content in the titanium carbonitride in contact with the substrate or the chlorine content on average of titanium nitride of 0.1 to 2 μm in thickness, in contact with the substrate, and titanium carbonitride directly above it, in the above described inner layer, is at most 0.05 atom %, (3) a coated cutting tool characterized in that in the titanium carbonitride in contact with the above described substrate or the titanium carbonitride directly above the titanium nitride of 0.1 to 2 μm in thickness, in contact with the substrate, of planes having diffraction peaks appeared between X-ray diffraction angles 2θ=20°–140°, I (hkl)/I (220), ratio of the sum I of the diffraction peak intensities of plane (hkl) having an interplanar spacing of 30°–60° with (220) plane to the peak intensity I (220) of (220) plane satisfies the following relationship;
on average of from the substrate surface or titanum nitride surface to 0–3 μm:

$2.5 \leq I\ (hkl)/I\ (220) \leq 7.0$ on average of from the substrate surface or titanium nitride surface to 0–20 μm:

$2.5 \leq I\ (hkl)/I\ (220) \leq 15.0,$ (4) a coated cutting tool of (1) or (2), characterized in that in the titanium carbonitride in contact with the substrate or the titanium carbonitride directly above the titanium nitride of 0.1 to 2 μm in thickness, in contact with the substrate, in the above described inner layer, of planes having diffraction peaks appeared between X-ray diffraction angles 2 θ=20°–140°, I (hkl)/I (220), ratio of the sum I of the diffraction peak intensities of plane (hkl) having an interplanar spacing of 30°–60° with (220) plane to the peak intensity I (220) of (220) plane satisfies the following relationship;
on average of from the substrate surface or titanum nitride surface to 0–3 μm:

$2.5 \leq I\ (hkl)/I\ (220) \leq 7.0$ on average of from the substrate surface or titanum nitride surface to 0–20 μm:

$2.5 \leq I\ (hkl)/I\ (220) \leq 15.0,$ (5) a coated cutting tool characterized in that when in X-ray diffractions of the titanium carbonitride in contact with the above described substrate or the titanium carbonitride directly above the titanium nitride of 0.1 to 2 μm in thickness, in contact with the substrate, the peak intensity of (311) plane is I (311) and the peak intensity of (220) plane is I (220), the value of I (311)/I (220) satisfies the following relationship;
on average of from the substrate surface or titanum nitride surface to 0–3 μm:

$0.5 \leq I\ (311)/I\ (220) \leq 1.5$ on average of from the substrate surface or titanium nitride surface to 0–20 μm:

$0.5 \leq I\ (311)/I\ (220) \leq 6.0,$ (6) a coated cutting tool of any one of (1) to (4), characterized in that when in X-ray diffractions of the titanium carbonitride in contact with the substrate or the titanium carbonitride directly above the titanium nitride of 0.1 to 2 μm in thickness, in contact with the substrate, in the above described inner layer, the peak intensity of (311) plane is I (311) and the peak intensity of (220) plane is I (220), the value of I (311)/I (220) satisfies the following relationship;
on average of from the substrate surface or titanum nitride surface to 0–3 μm:

$0.5 \leq I\ (311)/I\ (220) \leq 1.5$ on average of from the substrate surface or titanium nitride surface to 0–20 μm:

$0.5 \leq I\ (311)/I\ (220) \leq 6.0,$ (7) a coated cutting tool characterized in that when in X-ray diffractions of the titanium carbonitride in contact with the above described substrate or the titanium carbonitride directly above the titanium nitride of 0.1 to 2 μm in thickness, in contact with the substrate, the peak intensity of (111) plane is I (111) and the peak intensity of (220) plane is I (220), the value of I (111)/I (220) satisfies the following relationship;
on average of from the substrate surface or titanum nitride surface to 0–3 μm:

$1.0 \leq I\ (111)/I\ (220) \leq 4.0$ on average of from the substrate surface or titanium nitride surface to 0–20 μm:

$1.0 \leq I\ (111)/I\ (220) \leq 8.0,$ (8) a coated cutting tool of any one of (1) to (6), characterized in that when in X-ray diffractions of the titanium carbonitride in contact with the substrate or the titanium carbonitride directly above the titanium nitride of 0.1 to 2 μm in thickness, in contact with the substrate, in the above described inner layer, the peak intensity of (111) plane is I (111) and the peak intensity of (220) plane is I (220), the value of I (111)/I (220) satisfies the following relationship;

on average of from the substrate surface or titanum nitride surface to 0–3 μm:

$$1.0 \leq I\ (111)/I\ (220) \leq 4.0$$

on average of from the substrate surface or titanum nitride surface to 0–20 μm:

$$1.0 \leq I\ (111)/I\ (220) \leq 8.0,$$

(9) a coated cutting tool characterized in that when in X-ray diffractions of the titanium carbonitride in contact with the above described substrate or the titanium carbonitride directly above the titanium nitride of 0.1 to 2 μm in thickness, in contact with the substrate, the peak intensity of (311) plane is I (311), the peak intensity of (111) plane is I (111) and the peak intensity of (220) plane is I (220), the value of [I (111)+I (311)]/I (220) satisfies the following relationship;

on average of from the substrate surface or titanum nitride surface to 0–3 μm:

$$2.0 \leq [I\ (111)+I\ (311)]/I\ (220) \leq 5.5$$

on average of from the substrate surface or titanum nitride surface to 0–20 μm:

$$2.0 \leq [I\ (111)+I\ (311)]/I\ (220) \leq 14.0,$$

(10) a coated cutting tool of any one of (1) to (8), characterized in that when in X-ray diffractions of the titanium carbonitride in contact with the substrate or the titanium carbonitride directly above the titanium nitride of 0.1 to 2 μm in thickness, in contact with the substrate, in the above described inner layer, the peak intensity of (311) plane is I (311), the peak intensity of (111) plane is I (111) and the peak intensity of (220) plane is I (220), the value of [I (111)+I (311)]/I (220) satisfies the following relationship;

on average of from the substrate surface or titanum nitride surface to 0–3 μm:

$$2.0 \leq [I\ (111)+I\ (311)]/I\ (220) \leq 5.5$$

on average of from the substrate surface or titanum nitride surface to 0–20 μm:

$$2.0 \leq [I\ (111)+I\ (311)]/I\ (220) \leq 14.0,$$

(11) a coated cutting tool of any one of (1) to (10), characterized in that the thickness of the titanium carbonitride in contact with the substrate or the titanium carbonitride directly above the titanium nitride of 0.1 to 2μm in thickness, in contact with the substrate, in the above described inner layer, is 1 to 20 μm,

(12) a coated cutting tool of any one of (1) to (11), characterized in that the above described substrate consists of a tungsten carbide-based cemented carbide or titanium carbonitride-based cermet and the thickness of η phase on the outermost surface at the boundary between the coating layer and substrate in the vicinity of the cutting edge ridge line is at most 1 μm,

(13) a coated cutting tool of any one of (1) to (12), characterized in that the total film thickness of the above described inner layer and outer layer is 2 to 100 μm.

(14) a coated cutting tool characterized in that in a coated cutting tool comprising a hard coating layer consisting of an inner layer and outer layer, formed on a surface of a substrate consisting of an alloy of at least one hard component, as a predominant component, selected from the group consisting of carbides, nitrides and carbonitrides of Group IVa, Va and VIa elements of Periodic Table and a Group VIII metallic component, the inner layer is composed of a multi-layer consisting of a first layer of titanium nitride in contact with the substrate, a second layer thereon of titanium carbonitride having a hardness of 1600 to 2400 kg/mm$^2$ and a further coating layer thereon of at least one member selected from the group consisting of carbides, nitrides, carbonitrides and boronitrides of titanium, and the outer layer is composed of a mono-layer or multi-layer consisting of at least one member selected from the group consisting of aluminum oxide, zirconium oxide, hafnium oxide, titanium carbide, titanium carbonitride and titanium nitride,

(15) a coated cutting tool characterized in that in a coated cutting tool comprising a hard coating layer consisting of an inner layer and outer layer, formed on a surface of a substrate consisting of an alloy of at least one hard component, as a predominant component, selected from the group consisting of carbides, nitrides and carbonitrides of Group IVa, Va and VIa elements of Periodic Table and a Group VIII metallic component, as a first layer of the inner layer in contact with the substrate, titanium nitride with a thickness of 0.1 to 2.0 μm is coated, as a second layer, titanium carbonitride with a hardness of 1600 to 2400 kg/mm$^2$ is coated thereon and further a mono-layer or multi layer consisting of at least one member selected from the group consisting of carbides, nitrides, carbonitrides and boronitrides of titanium is coated thereon, and as the outer layer on the inner layer, a mono-layer or multi-layer consisting of at least one member selected from the group consisting of aluminum oxide, titanium carbide, titanium carbonitride and titanium nitride,

(16) a coated cutting tool of (14) or (15), characterized in that titanium carbonitride of the second layer is composed of column pillar crystal grains and the average crystal grain diameter of the titanium carbonitride is in the range of 0.1 to 1 μm when the second layer has a film thickness of at most 4.0 μm and in the range of 0.5 to 3.0 μm when the second layer has a film thickness of exceeding 4.0 μm and at most 20 μm,

(17) a coated cutting tool of (14) or (15), characterized in that the chlorine content in the above described inner layer is at most 0.05 atom % on average throughout the inner layer and

(18) a coated cutting tool of (17), characterized in that the chlorine content in the titanium carbonitride in contact with the substrate or the chlorine content on average of titanium nitride in contact with the substrate and titanium carbonitride directly above it, in the above described inner layer, is at most 0.05 atom %.

Secondly, the present invention provides a process for the production of a coated cutting tool comprising coating layers consisting of an inner layer and an outer layer on a surface of a substrate consisting of tungsten carbide-based cemented carbide, titanium carbonitride-based cermet, silicon nitride-based ceramics or aluminum oxide-based ceramics, the inner layer being composed of a mono-layer of titanium carbonitride in contact with the substrate, a double layer of titanium nitride of 0.1 to 2 $\mu$m in thickness, in contact with the substrate, and titanium carbo-nitride directly above it or a multi-layer consisting of at least one coating selected from the group consisting of carbides, nitrides, carbonitrides, boronitrides and borocarbonitrides of titanium on the titanium carbonitride of the mono-layer or double layer and the outer layer being composed of a mono-layer or multi-layer consisting of at least one member selected from the group consisting of aluminum oxide, zirconium oxide, hafnium oxide, titanium carbide, titanium carbonitride and titanium nitride, which has any one of the following constructions (19) to (22):

(19) A process for the production of a coated cutting tool, characterized in that titanium carbonitride to be in contact with the above described substrate or titanium carbonitride directly above titanium nitride having a thickness of 0.1 to 2 $\mu$m to be in contact with the substrate is coated onto the substrate by a chemical vapor deposition method using titanium tetrachloride as a titanium source and an organo CN compound as a carbon and nitrogen source and in an atmosphere with a nitrogen concentration of at least 26% at a temperature range of 800 to 950° C.

(20) A process for the production of a coated cutting tool, characterized in that titanium carbonitride to be in contact with the above described substrate or titanium carbonitride directly above titanium nitride having a thickness of 0.1 to 2 $\mu$m to be in contact with the substrate is coated onto the substrate by a chemical vapor deposition method using titanium tetrachloride as a titanium source and an organo CN compound as a carbon and nitrogen source at a temperature range of 950 to 1050° C.

(21) The process for the production of a coated cutting tool, described in any one of (1) to (13), characterized in that titanium carbonitride to be in contact with the above described substrate or titanium carbonitride directly above titanium nitride having a thickness of 0.1 to 2 $\mu$m to be in contact with the substrate is coated onto the substrate by a chemical vapor deposition method using titanium tetrachloride as a titanium source and an organo CN compound as a carbon and nitrogen source and in an atmosphere with a nitrogen concentration of at least 26% at a temperature range of 800 to 950° C.

(22) The process for the production of a coated cutting tool, as described in any one of (1) to (13), characterized in that titanium carbonitride to be in contact with the above described substrate or titanium carbonitride directly above titanium nitride having a thickness of 0.1 to 2 $\mu$m to be in contact with the substrate is coated onto the substrate by a chemical vapor deposition method using titanium tetrachloride as a titanium source and an organo CN compound as a carbon and nitrogen source at a temperature range of 950 to 1050° C.

(23) A process for the production of a coated cutting tool in which in a coated cutting tool comprising a hard coating layer consisting of an inner layer and outer layer, formed on a surface of a substrate consisting of an alloy of at least one hard component, as a predominant component, selected from the group consisting of carbides, nitrides and carbonitrides of Group IVa, Va and VIa elements of Periodic Table and a Group VIII metallic component, the inner layer is composed of a multi-layer consisting of a first layer of titanium nitride in contact with the substrate, a second layer of titanium carbonitride having a hardness of 1600 to 2400 kg/mm$^2$ and a further coating layer of at least one member selected from the group consisting of carbides, nitrides, carbonitrides and boronitrides of titanium, and the outer layer is composed of a mono-layer or multi-layer consisting of at least one member selected from the group consisting of aluminum oxide, zirconium oxide, hafnium oxide, titanium carbide, titanium carbonitride and titanium nitride, characterized in that titanium carbonitride to be in contact with the above described substrate or titanium carbonitride directly above titanium nitride to be in contact with the substrate is coated onto the substrate by a chemical vapor deposition method using titanium tetrachloride as a titanium source and an organo CN compound as a carbon and nitrogen source at a temperature range of 950 to 1050° C.

(24) A process for the production of a coated cutting tool in which in a coated cutting tool comprising a hard coating layer consisting of an inner layer and outer layer, formed on a surface of a substrate consisting of an alloy of at least one hard component, as a main component, selected from the group consisting of carbides, nitrides and carbonitrides of Group IVa, Va and VIa elements of Periodic Table and a Group VIII metallic component, as a first layer of the inner layer in contact with the substrate, titanium nitride with a thickness of 0.1 to 2.0 $\mu$m is coated, as a second layer, titanium carbonitride with a hardness of 1600 to 2400 kg/mm$^2$ is coated and further a mono-layer or multi-layer consisting of at least one member selected from the group consisting of carbides, nitrides, carbonitrides and boronitrides of titanium is coated thereon, and as the outer layer on the inner layer, a mono-layer or multi-layer consisting of at least one member selected from the group consisting of aluminum oxide, titanium carbide, titanium carbonitride and titanium nitride is coated, characterized in that titanium carbonitride to be in contact with the above described substrate or titanium carbonitride directly above titanium nitride having a thickness of 0.1 to 2 $\mu$m to be in contact with the substrate is coated onto the substrate by a chemical vapor deposition method using titanium tetrachloride as a titanium source and an organo CN compound as a carbon and nitrogen source at a temperature range of 950 to 1050° C.

BEST EMBODIMENT FOR CARRYING OUT THE INVENTION

In the coated cutting tool of the present invention, remarkable improvements of not only the service life of the tool, but also the stability are first rendered possible by suppressing the chlorine content in the coating layer to a very small amount, i.e. at most 0.05 atom % on average of the inner layer.

This is firstly due to that the hardness of the film is largely improved and the wear resistance of the film itself is markedly improved by reducing the chlorine content in the coating layer to this level and secondly due to that the adhesiveness between the substrate and film, and between the inner layer and outer layer is largely improved, thus suppressing progress of wearing due to stripping of at the interface thereof during cutting. Since the stripping at the interface between the substrate and coating layer during cutting causes exposure of the substrate, leading to remarkable lowering or dispersion of the service life of the tool, it is desirable to suppress the chlorine content in the titanium carbonitride in contact with the substrate or the chlorine content of titanium nitride in contact with the substrate and titanium caronitride directly above it, in the above described inner layer, to at most 0.05 atom %.

As a method of measuring the chlorine content in the film, the measurement is carried out by the use of AgCl, as a standard sample, and an electronic beam probe microanalyser (EPMA).

Up to the present time, it has been reported to decrease the level of the chlorine content in a coating film to about 1 atom %, as described above, thus obtaining good film quality, and to coat titanium carbide double layers differing in chlorine content, but such a low level of the chlorine content in the whole coating layer as at most 0.05 atom % has not been examined. In contrast, the present invention is based on finding that remarkable improvements of the wear resistance and the stripping resistance at the interface between the substrate and film during cutting are first rendered possible by decreasing the chlorine content in the whole coating layers to a level of at most 0.05 atom %. In the present invention, it is essential to specify a low chlorine content in this range, whereby a coating layer having a higher hardness, wear resistance and adhesiveness can first be obtained.

The coated cutting tool of the present invention has such a structure that titanium carbonitride is directly coated onto the substrate as the inner layer or that titanium nitride is coated with a thickness of 0.1 to 2 μm and titanium carbonitride is coated thereon, whereby bad influences of chlorine can be removed by stabilizing nucleus formation during film making, as one benefit of the present invention.

The titanium carbonitride and titanium nitride are very uniform since the nucleus formation during film forming is not so affected by the state of the substrate. If the nucleus formation is not uniform, chlorine formed by reduction of titanium tetrachloride during the film forming reaction tends to segregate to cause lowering of the stripping resistance of the coating layer. When the substrate is of a cemented carbide or cermet, the binder phase (cobalt, nickel, etc.) near the surface of the substrate is etched with chlorine, so that the strength of the substrate, near the surface thereof, is lowered and the service life of the tool is decreased.

In the case of such a structure that titanium nitride is coated as a layer to be contacted with the substrate, a titanium nitride thickness of less than 0.1 μm results in that the film forming of titanium nitride is not sufficiently uniform, independently of the substrate position, and there thus occur sites where the titanium carbonitride coated thereon is subject to direct and partial nucleus formation. Consequently, the nucleus formation of titanium nitride and titanium carbonitride occurs, resulting in a non-uniform coating on the substrate, and the effect of removing the bad influences of chlorine cannot sufficiently be exhibited. On the contrary, when the titanium nitride thickness exceeds 2 μm, the wear resistance during cutting is unfavourably affected.

Accordingly, for a film contacted with the substrate, it is required to have such a structure that titanium carbonitride is directly coated or that titanium nitride with 0.1 to 2 μm is coated directly on the substrate and titanium carbonitride is coated thereon.

When a titanium nitride film is formed directly on a substrate, the film grain size can be decreased by providing suitable conditions and correspondingly, the grain size of a titanium carbonitride film thereon tends to be finer. When a titanium carbonitride film is formed by an MT-CVD method, there is a possibility of deposition of free carbon in the vicinity of the interface under constant gaseous conditions in the case of using, as a substrate, an alloy whose carbon content near the surface is different due to difference of the carbon content in the alloy or due to difference of an amount of decarburization near the surface during sintering, but the presence of a titanium nitride film is capable of moderating these influences One feature of the coated cutting tool of the present invention is that the preferred orientation of the titanium carbonitride layer in direct contact with the substrate or the titanium carbonitride layer directly on the titanium nitride, as an inner layer, in direct contact with the substrate is in the specified range.

The coating of titanium carbide, etc. by a heat-assisted CVD method, as described above, tends to be orientated in (220) plane as a primary slip plane and breakage of the tool tends to occur during working.

In the present invention, the value of I (hkl)/I (220) in the titanium carbonitride directly above the titanium nitride in contact with the substrate or in the titanium carbonitride in contact with the substrate is taken from the ratio of the sum I (hkl) of the diffraction peak intensities of plane (hkl) having an interplanar spacing of 30°–60° with (220) plane to the peak intensity I (220) of (220) plane, of planes having diffraction peaks appeared between X-ray diffraction angles 2θ=20°–14°. The plane angle φ with (220) plane is represented by the following formula in view of that titanium carbonitride has a cubic crystal structure:

$$\cos\phi = \frac{2 \times h + 2 \times k}{2^{3/2} \times (h^2 + k^2 + l^2)^{1/2}}$$

That is, I (hkl) means I (hkl)=I (111)+I (200)+I (311)+I (422)+I (511) [(222) plane is omitted because of being equal to (111) plane].

The preferred orientation of planes inclined (30°–60°) to (220) plane, i.e. the primary slip plane should be controlled so as to satisfy the following relationship, in terms of X-ray intensity ratio:

on average of from the substrate surface or titanium nitride surface to 0–3 μm and on average of from the substrate surface or titanium nitride surface to 0–20 μm:

2.5≦I (hkl)/I (220)

Thus, the strength against the shearing strength during cutting is largely strengthened.

Moreover, if the preferred orientation is too strong at the initial stage of forming the coating layer, the nucleus formation on the substrate surface is affected in this case to lower the adhesiveness. Thus, the preferred orientation of (hkl) plane should be controlled so as to satisfy the following relationship, in terms of X-ray intensity ratio:

on average at a position of a thickness of 0–3 μm from the substrate surface or titanium nitride surface:

$$I\ (hkl)/I\ (220) \leq 7.0$$

on average at a position of a thickness of 0–20 μm from the substrate surface or titanum nitride surface:

$$I\ (hkl)/I\ (220) \leq 15.0$$

In the cutting tool of the present invention, the preferred orientation of (hkl) plane in the titanium carbonitride directly above the titanium nitride in contact with the substrate or in the titanium carbonitride in contact with the substrate in the range of 0–3 μm and 0–20 μm from the substrate surface or titanium nitride surface is controlled in the above described range, whereby the adhesiveness at the interface with the substrate can be improved and simultaneously, breakage of the film itself during cutting can be suppressed.

Furthermore, the above described effect can be enhanced by controlling the preferred orientation of the titanium carbonitride directly above the titanium nitride in contact with the substrate or the titanium carbonitride in contact with the substrate in the following range.

In the present invention, the value of I (311)/I (220) in the titanium carbonitride directly above the titanium nitride in contact with the substrate or in the titanium carbonitride in contact with the substrate is taken from the ratio of the peak intensities of (311) plane and (220) plane in X-ray diffraction. Since the intensity ratio of X-ray in orientation-free titanium carbonitride powder is represented by I (311)/I (220)=0.5, the range of at least 0.5 according to the present invention means the orientation to (311) plane rather than to (220) plane.

(311) plane is a plane having an angle of about 32° against the primary slip plane and the orientation of this plane should be controlled so as to satisfy the following relationship, in terms of X-ray intensity ratio:

$$0.5 \leq I\ (311)/I\ (220)$$

on average of 0–3 μm and 0–20 μm from the substrate surface or titanium nitride surface, whereby the strength against shearing during cutting can largely be increased.

Moreover, if the preferred orientation of the coating layer is too strong at the initial stage of forming the coating layer, the nucleus formation on the basic surface is affected in this case to lower the adhesiveness. Thus, the preferred orientation of (311) plane should be controlled so as to satisfy the following relationship, in terms of X-ray intensity ratio:

$$I\ (311)/I\ (220) \leq 1.5$$

on average of 0–3 μm from the substrate surface or titanium nitride surface and $$I\ (311)/I\ (220) \leq 6.0$$

on average of 0–20 μm from the substrate surface or titanium nitride surface.

In the cutting tool of the present invention, the preferred orientation of (311) plane of the titanium carbonitride layer up to 0–3 μm and 0–20 μm is controlled in the above described range, whereby the adhesiveness at the interface of the film and substrate can be improved and simultaneously, breakage of the film itself during cutting can be suppressed.

One of the features of the present invention is that when the peak intensity of (111) plane is I (111) and the peak intensity of (220) plane is I (220) in the X-ray diffractions, the value of I (111)/I (220) in the titanium carbonitride directly above the titanium nitride in contact with the substrate or in the titanium carbonitride in contact with the substrate is represented as follows:

$$1.0 \leq I\ (111)/I\ (220) \leq 4.0$$

on average of up to 0–3 μm and $$1.0 \leq I\ (111)/I\ (220) \leq 8.0$$

on average of up to 0–20 μm.

The preferred orientation of (311) plane in the titanium carbonitride directly above the titanium nitride in contact with the substrate of the inner layer or in the titanium carbonitride in contact with the substrate in the range of 0–3 μm and 0–20 μm is controlled in the above described range, whereby breakage of the film itself during cutting can be suppressed similarly to the case of the orientation to (311) plane.

Furthermore, this effect can be enhanced by satisfying the following relationship:

on average of from the substrate surface or titanum nitride surface to 0–3 μm:

$$2.0 \leq [I\ (111)+I\ (311)]/I\ (220) \leq 5.5$$

on average of from the substrate surface or titanum nitride surface to 0–20 μm:

$$2.0 \leq [I\ (111)+I\ (311)]/I\ (220) \leq 14.5,$$

namely, by the orientation to (111) plane and (311) plane inclined to (220) plane.

When the film thickness exceeds 20 μm and the relationship of 6.0<I (311)/I (220), 8.0<I (111)/I (220) or 14.0<[I (111)+I (311)] is satisfied, however, the preferred orientation is so strong that the nucleus-forming state during coating the outer layer is affected to result in stripping at the interface of the coating layer during working. This is not favourable.

Moreover, if the preferred orientation of the coating layer is too strong at the initial stage of forming the coating layer, the nucleus formation on the basic surface is affected in this case to lower the adhesiveness at the interface thereof. Thus, the preferred orientation of (311) plane should be controlled so as to satisfy the following relationship, in terms of X-ray intensity ratio:

$$I\ (311)/I\ (220) \leq 1.5$$

$$I\ (111)/I\ (220) \leq 4.0\ \text{or}$$

$$[I\ (111)+I\ (311)]/I\ (220) \leq 5.5.$$

The film thickness of the coating layer of titanium carbonitride directly above titanium nitride in contact with the substrate or titanium carbonitride in contact with the substrate is preferably in the range of 1 to 20 μm, since if less than 1 μm, the effect of preventing breakage of the film near the interface is decreased, while if more than 20 μm, the preferred orientation is too strong and bad influences appear.

For the purpose of obtaining the intensity of each plane such as I (hkl)/I (220), etc., an ordinary X-ray diffraction method using a X-ray tube of Cr or V is used. When an X-ray peak intensity at a relatively thin position of titanium carbonitride coated on a cemented carbide substrate is obtained, however, X-ray permeates through the substrate, so the peak of tungsten carbide (WC) appears. Since the peak positions of (111) plane of tungsten carbide and (311) plane of titanium carbonitride are superimposed one upon the other, they cannot be separated (the separation is impossible even if using a X-ray tube of V most suitable for peak separation). Thus, I (311) is ordinarily obtained by seeking $I_{WC}$ (111) from the peak ratio of (101) plane as the highest peak of tungsten carbide and (111) plane $[I_{0WC}$ (101)/$I_{0WC}$ (111)=0.25 from ASTM card, $I_{WC}$ (111)=0.25×$I_{WC}$ (101)] using the diffraction pattern of tungsten carbide powder (the tungsten carbide substrate has ordinarily no orientation) and subtracting this from the peak intensity at the position of (311).

As an effect of coating titanium nitride with a thickness of 0.1 to 2 μm as a layer in contact with the substrate, the preferred orientation of titanium carbonitride on the titanium nitride is controlled due to stabilization of nucleus formation during film making of the titanium nitride (the nucleus formation is not so affected by the state of the substrate and is very compact and uniform) in addition to the effect of removing the bad influences by chlorine, as described above. Thus, the preferred orientation of titanium carbonitride can stably be controlled in the scope of the present invention independently of the variety, composition, surface state, etc. of a substrate. If the thickness of the layer is less than 0.1 μm, this effect is not achieved and controlling of the orientation is difficult, while if at least 2 μm, the wear resistance during cutting is unfavorably affected. Accordingly, the thickness of the titanium nitride should be in the range of 0.1 to 2 μm.

The further feature of the present invention consists in that the titanium carbonitride formed on the titanium nitride film has the specified hardness or the specified hardness and structure. Namely, the titanium carbonitride, as the second layer, has a hardness of 1600 to 2400 kg/mm² and is composed of columnar crystal grains, most preferably having an average crystal grain diameter of 0.1 to 1 μm when the second layer has a film thickness of at most 4.0 μm or 0.5 to 3.0 μm when the second layer has a film thickness of exceeding 4.0 μm and at most 20 μm.

The chlorine content in the inner layer consisting of the first layer and second layer is preferably at most 0.05 atom % on average of the whole inner layer.

The hardness of a film described in this specification means Microvickers hardness or Knoop hardness, which is specifically measured by polishing the film surface in parallel to or with a suitable angle to a substrate, applying an indentation of Vickers or Knoop to the polished surface, for example, with a load of 25 to 50 g for a loading time of 10 to 20 seconds and then measuring the size of the indentation. In the measurement of the hardness of a thin film for a tool, if the penetration depth of an indentation piece exceeds the film thickness, measurement of a correct hardness is impossible, so it is required to select a measurement method and a load so that the penetration depth be at most half of the film thickness. A dynamic hardness measurement method (method for obtaining a hardness from the relationship of the penetration depth of an indentation piece and the penetration load), developed as a thin film measurement method, is not preferable as a hardness measurement method of a coated cutting tool, because comparison of the resulting measured value and Vickers hardness (or Knoop hardness) is difficult as an absolute value.

On the other hand, the average crystal grain diameter means the size of a crystal grain at the end of a columnar crystal, namely the thickness of the end of a columnar crystal when observing by a scanning electron microscope from the film surface when the thickness of the film is adjusted to 0.1 to 20 μm. Estimation of the average crystal grain diameter is carried out by taking a surface photograph through a microscope and when one hundred crystal grains are seen in a predetermined visual field in the surface photograph, for example, by dividing the length of one side, 10 μm by 10 corresponding to a square root of 100 to obtain 1 μm. Crystal grains protruded out of the visual field even to a small extent are counted as 0.5. In the case of a laminated layer, however, the grown surface of the film cannot directly be observed and accordingly, estimation of the average crystal grain diameter is carried out by a method comprising polishing a coating layer of a coated cemented carbide in parallel to or with a suitable angle to the substrate (preferably 10°), treating with a suitable etching solution (mixed solution of hydrofluoric acid, nitric acid and distilled water, etc.) to emboss a crystal grain boundary and then observing by a scanning electron microscope, or a method comprising observing a sliced sample by a transmission type electron microscope. In any case, the crystal grain diameter is calculated from a photograph taken with a suitable magnification. However, calculation of the average crystal grain diameter by an X-ray diffraction method is not preferable because the calculated value tends to be affected by a residual stress, etc. in the film.

The titanium carbonitride film having the specified hardness or the specified hardness and structure, as described above, can readily be formed by a MT-CVD method. Formation of the titanium carbonitride film of this second layer is carried out by using acetonitrile, hydrogen gas, titanium tetrachloride, etc. as a main raw material, to which nitrogen or argon is then further added, and then maintaining the mixture by a substrate temperature of 800 to 980° C. and a reactor pressure of 40 to 150 Torr.

The grounds for specifying the hardness and structure of the titanium carbonitride film are as follows:

As to the film hardness, firstly, it is generally thought that the higher the hardness, the more excellent the wear resistance, but this is a tendency in a moderate wear at about room temperature, which is called "abrasive wear". When titanium-type ceramics such as titanium nitride, titanium carbonitride or titanium carbide are applied to cutting tools, therefore, titanium carbide is most excellent so as to improve the durability thereof for the abrasive wear.

In the friction wear accompanied by impact or heat as in cutting tools, the toughness or oxidation resistance is inferior when only the hardness is high and consequently, abnormal wear often occurs to shorten the service life of the cutting tool. Accordingly, it is desirable for attaining a stable and long life to provide a micro structure, which is hard to be breakable or tends to be little broken, with a suitable hardness as well as oxidation resistance. For this purpose, titanium carbonitride having both the merits of titanium carbide having excellent oxidation resistance and titanium nitride having excellent hardness is most suitable.

In the present invention, the hardness and micro structure of titanium carbonitride is examined in detail to determine the optimum ranges thereof.

That is, the micro structure of the titanium carbonitride will thereafter be illustrated, but it is now found that the optimum range of the hardness of the titanium carbonitride is in the range of at least 1600 kg/mm$^2$ and at most 2400 kg/mm$^2$ for the purpose of the present invention.

Titanium type ceramics represented by the general formula $Ti_1C_xN_{1-x}$ ($0 \leq x \leq 1$) have the property that the larger is x, the higher is the hardness. The hardness is considered to be substantially linearly increased with the increase of the value of x from 2000 kgf/mm$^2$ when x=0 (i.e. TiN) to 3000 kgf/mm$^2$ when x=1 (i.e. TiC). However, the hardness depends upon the ratio with Ti, impurities, residual stress, micro structures, etc. in addition to the ratio of C and N. In the present invention, it is not clear how the film called "titanium carbonitride" is affected by these various factors, and it is found, however, that at a hardness of 1600 kg/mm$^2$ to 2400 kg/mm$^2$, the most stable film for tools can be obtained. If the hardness is smaller than 1600 kg/mm$^2$, wear proceeds fast, which should be avoided, while if the hardness is larger than 2400 kg/mm$^2$, the toughness is extremely lowered to be readily breakable. This is not preferable.

When the hardness of the titanium carbonitride film is present in the above described range, a tool having a relatively stable service life can be obtained, and it is further preferable that the micro structure of the film is optimized.

The titanium carbonitride film coated by an MT-CVD method has various micro structures depending on the conditions of coating. According to the inventors' studies, it is found that typical ones of such micro structures can be classified into the following three types:

(Type 1) The film surface is composed of secondary grains consisting of aggregated dome-shaped primary grains. In many cases, the crystal grain diameters of the primary grains are smaller than 0.1 μm. The concentrations of raw material gases in a film-forming atmosphere are so high that the film is formed when the growth rate of the film is at least 2 μm per hour and the vapor deposition temperature is lower.

(Type 2) The film surface is composed of primary grains of a clear polygonal shape, having a columnar cross-sectional structure, each of the columns being small-sized. Namely, the growth of the columnar crystal grain is of a tapered shape at the initial stage and when the film thickness exceeds 2 μm, the size of the column is not so changed. This is seen when the vapor deposition temperature is correct and the concentrations or ratios of raw material gases are correct. The relationship between the specific average crystal grain diameter and the film thickness is illustrated below:
Film Thickness at most 4.0 μm: Grain Diameter 0.1 to 1 μm
Film Thickness 4.0 μm to 20 μm: Grain Diameter 0.5 to 3.0 μm For the purpose of the present invention, this type is preferable. In cutting tools, a titanium carbonitride layer with a thickness exceeding 20 μm is not realistic because of resulting in lowering of the toughness of the tools.

(Type 3) The film surface is composed of primary grains of a clear polygonal shape, having a columnar cross-sectional structure, each of the columns being thickened with the growth of the film. That is, the growth of the columnar crystal grains is taper-like and the thickness of the columns is increased with the increase of the film thickness without satisfying the relationship of the crystal grain diameter and the film thickness in Type 2. This is seen when the vapor deposition temperature is higher or when the growth rate is lower because of low concentrations of raw material gases.

Tools were prepared on an experimental basis by forming a titanium carbonitride film on a substrate as an undercoated intermediate layer, as described above, and then forming the titanium carbonitride film of the above described three types thereon, and subjected to assessment of the flank wear width in a cutting test. Consequently, it has been found that the resulting films of these types have the following features:

(Type 1) The wear resistance of the film is low, resulting in a rapid progress of from the normal wear of the film to exposure of the substrate, melt deposition and-abnormal wear.

(Type 2) The film shows the normal wear and a very long service life because of the high wear resistance of the film.

(Type 3) The film shows the high wear resistance similarly to Type 2 and gives a considerably long service life to the tool, but there often take place abnormal wear, e.g. localized breakage of the film leading to an abnormal breakage of the substrate.

It is assumed, in the case of the film of Type 1, that since the crystalline property of the titanium carbonitride film is low and binding of the grains making up the film with each other is weak, the film is worn collapsed.

In the case of the film of Type 3, on the other hand, it is assumed that the wear resistance is excellent, but the film tends to be broken on a large area because of the large crystal grain diameters, resulting in abnormal wear, i.e. chipping of the tool edge, etc.

In contrast, the film of Type 2 exhibits such an excellent wear resistance and stable normal wear that the object of the present invention can be achieved without causing abnormal wear of the tool.

As a preferable process for the production of a titanium carbonitride coating film having a tenacious adhesiveness to a base and excellent wear resistance as well as good stripping resistance, in which the chlorine content in the coating layer is at most 0.05 atom % and/or the ratio of the peak intensities in X-ray diffraction of the titanium carbonitride directly above the titanium nitride in contact with the substrate or the titanium carbonitride in contact with the substrate is present in the above described range, there is a process comprising forming a coating layer of titanium carbonitride at a temperature range of 950 to 1050° C. by a chemical vapor deposition method using titanium tetrachloride as a Ti source and an organo CN compound as a carbon and nitrogen source.

The temperature range of 950 to 1050° C. for forming the film is a high temperature range substantially the same as in the heat-assisted CVD method of the prior art, using methane and nitrogen as a carbon and nitrogen source, but no reports have been made up to the present time on studies in such a high temperature range when using the raw materials of the present invention.

When a coating layer is formed at a temperature range of 950 to 1050° C. by the heat-assisted CVD method of the prior art, η phase is deposited thick at the edge ridge line part, depending on the kind of the substrate, and the coating layer including the η phase tends to be stripped during cutting, resulting in decrease of the tool life. In contrast, according to the present invention, the thickness of η phase at the edge ridge line part can be controlled to a very small thickness, i.e. at most 1 μm even in the coating at this temperature range by the use of an organo CN compound as a carbon and nitrogen source. This is one useful feature of the present invention.

Furthermore, formation of a titanium carbonitride film excellent in wear resistance, breakage resistance in the coating layer and adhesiveness at the interface between the substrate and coating layer is rendered possible by the use of an organo CN compound at such a temperature range.

In the prior art, titanium nitride (TiN) is coated thin at a relatively low temperature side with such a film thickness of up to about 2 μm that the wear resistance is not affected to suppress deposition of the η phase, since the wear resistance is lowered if titanium nitride is coated thick, but there arises a problem that when titanium carbonitride (TiCN) is coated thereon by the heat-assisted CVD method, the η phase is deposited.

On the contrary, it is found that when the thickness of titanium nitride in contact with the substrate is adjusted to 0.1 to 2 μm and titanium carbonitride is coated thereon by the use of an organo CN compound at a higher temperature than in the prior art according to the present invention, the formation of then phase can be suppressed to a considerable extent in spite of that titanium nitride is coated thin, i.e. to give a thickness of 0.1 to 2 μm and titanium carbonitride is coated thereon.

Another feature of the process of the present invention consists in that titanium carbonitride very excellent in wear resistance and breakage resistance in the coating layer can be formed by effecting the coating of titanium carbonitride using an organo CN compound at the temperature range of the present invention. The chemical vapor deposition method using an organo CN compound has hitherto been carried out, but the feature of the prior art process has been considered to be that titanium carbonitride can be coated at a relatively low temperature side and deposition of η phase can thus be avoided, and the process has generally been carried at a low temperature side of about 800 to 900° C. In the coating at such a temperature range, however, the chlorine content in the coating layer is more and there can be formed only the coating layer having a low hardness and low wear resistance, by itself. The coating at such a low temperature range results in insufficiency of the stripping resistance.

Reversely, it has been found by the present study that when coating is carried out at a temperature of high temperature side, e.g., exceeding 1050° C., using an organo CN compound, η phase is deposited thick at the ridge line part of the edge on the substrate surface and concerning the preferred orientation that of (220) plane is strengthened to result in breakage in the film and falling-off of the coating phase from the η phase, leading to decrease of the tool life. Therefore, at the film-forming temperature range, a temperature range of 950 to 1050° C. according to the present invention yields a good film quality.

However, there can be obtained a film having the preferred orientation present in the scope of the present invention and a high breakage resistance in the film and high adhesiveness even at a low temperature, for example, about 800 to 950° C. by adjusting the proportion of $N_2$ in the mixed gases to at least 26%.

Since the bonding strength of the coating layer (adhesiveness of the substrate and inner layer and adhesiveness of the inner layer and outer layer) and the breakage resistance of the coating layer during cutting working can be improved according to the process of the present invention, it is confirmed that a much thicker film of up to 100 μm in thickness can be used without occurrence of stripping and breakage in the film according to the present invention in spite of the fact that the thickness of the coating layer in the coated cutting tools of the prior art, which have been put to practical use, is at most about 10 to 15 μm. If the thickness exceeds 100 μm, however, there occurs breakage in the coating layer during working with a small feed. This is not preferable. In the case of a thick film coating layer exceeding 15 μm, it is particularly effective to combine with a treatment for reducing the residual stress in the coating layer after coating.

This treatment comprises imparting a mechanical impact or thermal impact to the surface of the coating layer after coating and thus increasing cracks in the film thickness direction of the coating layer more than after being coated, thereby moderating the residual stress in the coating layer and improving the breakage resistance of the coating layer. In particular, this treatment is effective in a working having a larger burden to the coating layer as in light cutting workings.

The present invention will specifically be illustrated by the following examples:

EXAMPLE 1

Using a tungsten carbide-based cemented carbide with a shape of CNMG 120408 of ISO P 10 as a substrate, coating layers having structures of A1 to H1, P1, Q1 and R1 shown in Table 1 were formed on the surface thereof. During the same time, formation of titanium nitride of the inner layer to be contacted with the substrate was carried out at 950° C. in a stream of mixed gases of 1% of titanium tetrachloride, 50% of nitrogen ($N_2$) and 49% of hydrogen ($H_2$). Formation of titanium carbonitride of the inner layer was carried out at a temperature of 900 to 1100° C. as shown in Table 1 under gaseous conditions using a stream of mixed gases of 95% of $H_2$, 4% of titanium tetrachloride and 1 to 3% of acetonitrile ($CH_3CN$) at a furnace pressure of 60 Torr. The thickness of the coating layer was controlled by changing the retention time.

The chlorine content in the film, preferred orientation and deposition thickness of η phase at the edge ridge line part of each of the products of the present invention are shown in Table 2. For comparison, Comparative Product I having the same film structure as Product A1 of the present invention, whose titanium carbonitride of the inner layer was formed by the heat-assisted CVD method of the prior art using methane and nitrogen ($N_2$) as a carbon and nitrogen source at 1000° C., was prepared as shown in Table 2.

The chlorine content in the film was measured by EPMA using AgCl as a standard sample.

As to each of these samples, assessment of the wear resistance, the wear resistance including film stripping and the stripping breakage of the film itself was carried out under the following Cutting Conditions 1 and 2, thus obtaining results as shown in Table 3. From these results, it will be understood that Products A1 to H1 and P1, Q1 and R1 of the present invention are more excellent in wear resistance, stripping resistance and breakage resistance in film, as compared with Comparative Product I.

In the products of the present invention, G1 exhibits a more residual chlorine content in the film and somewhat inferior wear resistance and stripping resistance, but is more improved in the breakage resistance in the film as compared with Comparative Product I. This is an effect caused by maintaining the preferred orientation in the scope of the present invention.

Product H1 of the present invention exhibits a weak preferred orientation of (311) plane and somewhat inferior breakage resistance in film, but is more improved in wear resistance as compared with Comparative Product I, which is caused by bringing the residual chlorine content in the film into the scope of the present invention. In H1, the stripping resistance of the coating layer is somewhat inferior in spite of that the chlorine content in the film is small, which is probably due to the thickness of the η phase.

The results of P1 and R1 teach the effect of the preferred orientation of (111) plane present in the scope of the present invention and the result of Q1 teaches the effect of the preferred orientation of (311) plane present in the scope of the present invention.

Cutting Conditions 1

Workpiece: SCM 415 (HB = 210)
Cutting Speed: 300 m/min                Feed: 0.35 mm/rev
Cutting Depth: 1.5 min                  Cutting time: 30 minutes
Cutting Oil: water-soluble Cutting Conditions 2

Workpiece: SCM 415 (HB = 180)
Cutting Speed: 250 m/min                Feed: 0.3 mm/rev
Cutting Depth: 1.5 mm
Cutting time: 1 pass = 10 sec, repeated 300 times
Cutting Oil: water-soluble

TABLE 1

| Sample | Temp. (°C.) | Film Structure and Film Thickness (μm) Outer Layer | Inner Layer | TiCN Film Thickness Just Above TiN Contacted with Substrate (μm) | Whole film Thickness of Coating Layer (μm) |
|---|---|---|---|---|---|
| A1 | 950  | TiN/TiCN/Al$_2$O$_3$ 0.5 0.5 2.0 | /TiCN/TiN/Sub. 8.0 0.5 | 8.0 | 11.5 |
| B1 | 950  | TiN/TiC/Al$_2$O$_3$ 0.5 0.5 2.0 | /TiBCN/TiC/TiCN/TiN/Sub. 0.5 3.0 1.0 2.0 | 1.0 | 9.5 |
| C1 | 1000 | TiN/Al$_2$O$_3$ 0.5 2.0 | /TiBCN/TiCN/TiN/Sub. 0.5 8.0 0.1 | 8.0 | 11.1 |
| D1 | 1000 | TiN/Al$_2$O$_3$ 2.0 3.0 | /TiCN/TiC/TiCN/TiN/Sub. 1.0 3.0 3.0 0.5 | 3.0 | 12.5 |
| E1 | 1050 | TiN/ZrO$_2$ 0.5 1.0 | /TiBCN/TiCN/TiN/Sub. 0.5 8.0 0.5 | 8.0 | 10.5 |
| F1 | 1050 | TiN/TiCN/HfO$_2$ 0.5 0.5 1.0 | /TiN/TiC/TiCN/TiN/Sub. 0.5 4.0 5.0 0.5 | 5.0 | 12.0 |
| G1 | 900  | TiN/TiCN/Al$_2$O$_3$ 0.5 0.5 2.0 | /TiCN/TiN/Sub. 8.0 0.5 | 8.0 | 11.5 |
| H1 | 1100 | TiN/TiCN/Al$_2$O$_3$ 0.5 0.5 2.0 | /TiCN/TiN/Sub. 8.0 0.5 | 8.0 | 11.5 |
| P1 | 1050 | TiN/Al$_2$O$_3$ 0.5 1.0 | /TiCN/TiN/Sub. 2.0 0.1 | 2.0 | 3.6 |
| Q1 | 950  | TiN/Al$_2$O$_3$ 0.5 1.0 | /TiC/TiCN/TiN/Sub. 1.0 1.0 0.1 | 1.0 | 3.6 |
| R1 | 1060 | TiN/Al$_2$O$_3$ 0.5 1.0 | /TiCN/TiN/Sub. 2.0 0.1 | 2.0 | 3.6 |

(Note)
"Sub." in this table and other tables means "Substrate".

TABLE 2

| Sample | Mean Cl Content of TiN Contacted with Sub. and TiCN just above TiN (at %) | Cl Content of Inner Layer (at. %) | I(311)/I(220) of TiCN just above TiN Contacted with Sub. 0–3 μm | I(311)/I(220) of TiCN just above TiN Contacted with Sub. 0–20 μm | Thickness of η Phase at Edge Ridge Line Part (μm) | I(111)/I(220) of TiCN just above TiN Contacted with Sub. 0–3 μm | I(111)/I(220) of TiCN just above TiN Contacted with Sub. 0–20 μm | [I(311)+I(111)]/I(220) of TiCN just above TiN Contacted with Sub. 0–3 μm | [I(311)+I(111)]/I(220) of TiCN just above TiN Contacted with Sub. 0–20 μm |
|---|---|---|---|---|---|---|---|---|---|
| A1 | 0.04 | 0.04 | 1.5 | 2.5(~8 μm) | 0 | 4.0 | 7.0 | 5.5 | 9.5 |
| B1 | 0.03 | 0.05 | 0.5 | — | 0 | 1.5 | — | 2.0 | — |
| C1 | 0.01 | 0.01 | 1.0 | 1.5(~8 μm) | 0.5 | 3.7 | 8.0 | 4.7 | 9.5 |
| D1 | 0.01 | 0.03 | 1.0 | — | 0.5 | 2.5 | — | 3.5 | — |
| E1 | 0.01 | 0.015 | 0.6 | 1.0(~8 μm) | 1.0 | 1.5 | 1.5 | 2.1 | 2.5 |
| F1 | 0.01 | 0.04 | 0.6 | 0.9(~5 μm) | 1.0 | 4.0 | 2.0 | 4.6 | 2.9 |
| G1 | 0.15 | 0.15 | 1.5 | 5.5(~8 μm) | 0 | 1.3 | 1.4 | 2.8 | 6.9 |
| H1 | 0.01 | 0.01 | 0.7 | 0.45(~8 μm) | 2.0 | 1.2 | 1.4 | 1.9 | 1.85 |
| I | 0.10 | 0.10 | 0.4 | 0.35(~8 μm) | 3.5 | 0.3 | 0.3 | 0.7 | 0.65 |
| P1 | 0.05 | 0.06 | 0.2 | — | 0.5 | 1.7 | — | 1.9 | — |
| Q1 | 0.05 | 0.07 | 1.5 | — | 0.5 | 0.3 | — | 1.8 | — |
| R1 | 0.05 | 0.06 | 0.2 | — | 0.5 | 1.0 | — | 1.8 | — |

TABLE 3

| Sample | Cutting Conditions 1 Average Flank Wear Width (mm) | Cutting Conditions 2 Average Flank Wear Width (mm) | Cutting Conditions 2 Stripping of Coating Layer | Cutting Conditions 2 Breakage in Film |
|---|---|---|---|---|
| A1 | 0.192 | 0.169 | no | no |
| B1 | 0.181 | 0.179 | no | no |
| C1 | 0.170 | 0.170 | no | no |
| D1 | 0.175 | 0.171 | no | no |
| E1 | 0.184 | 0.169 | no | no |
| F1 | 0.186 | 0.165 | no | no |
| G1 | 0.211 | 0.225 | yes (a little) | no |
| H1 | 0.188 | 0.265 | yes (much) | yes (somewhat much) |
| I | 0.240 | 0.380 | yes (much) | yes (much) |
| P1 | 0.213 | 0.225 | no | no |
| Q1 | 0.220 | 0.222 | no | no |
| R1 | 0.216 | 0.226 | no | no |

EXAMPLE 2

Using a titanium carbonitride-based cermet with a shape of CNMG 120408 of ISO P 10 as a substrate, coating layers having the same structures as A1, C1, E1, P1 and Q1 shown in Table 1 were formed on the surface thereof to prepare Samples A2, C2, E2, P2 and Q2 and subjected to assessment under the same cutting conditions as Conditions 1 and 2 of Example 1. The results are shown in Table 4.

For comparison, Sample I 2 having the same film structure as A1 of Table 1, which was formed by coating the cermet substrate by the heat-assisted CVD method of the prior art at 1000° C. was assessed to obtain results shown in Table 4. The film thickness, chlorine content and preferred orientation of each of these films were the same as the results of Tables 1 and 2, but no η phase was found at the edge ridge line part in any Samples. (In only Sample I 2, deposition of a metallic phase, probably due to Ni of the binder, was found in the coating layer).

From these results, it is apparent that in Comparative Sample I 2, the wear resistance of the film is insufficient and stripping of the film occurs due to an increased chlorine content in the inner layer and an increased content of chlorine in the titanium nitride in contact with the substrate and the titanium carbonitride directly above it. Breakage of the film in the coating layer is also observed because the preferred orientation of the titanium carbonitride layer is outside the scope of the present invention. In contrast, Samples A2, C2, E2, P2 and Q2 of the present invention are excellent in wear resistance, stripping resistance and breakage resistance in film.

TABLE 4

| Sample | Cutting Conditions 1 Average Flank Wear Width (mm) | Cutting Conditions 2 Average Flank Wear Width (mm) | Cutting Conditions 2 Stripping of Coating Layer | Cutting Conditions 2 Breakage in Film |
|---|---|---|---|---|
| A2 | 0.166 | 0.182 | no | no |
| C2 | 0.169 | 0.177 | no | no |
| E2 | 0.171 | 0.173 | no | no |
| I2 | 0.245 | broken | yes (much) | yes (much) |

TABLE 4-continued

| | Cutting Conditions 1 | Cutting Conditions 2 | | |
|---|---|---|---|---|
| Sample | Average Flank Wear Width (mm) | Average Flank Wear Width (mm) | Stripping of Coating Layer | Breakage in Film |
| P2 | 0.198 | 0.188 | no | no |
| Q2 | 0.196 | 0.179 | no | no |

EXAMPLE 3

Using a silicon nitride type ceramics with a shape of CNMG 120408 as substrate, coating layers having the same structures as A1, C1, E1, P1 and Q1 shown in Table 1 were formed on the surface thereof to prepare Samples A3, C3, E3, P3 and Q3 and subjected to assessment under the following Cutting Conditions 3 and 4. The results are shown in Table 5.

For comparison, Sample I 3 having the same film structure as A1 of Table 1, which was formed by coating the silicon nitride type ceramics substrate by the heat-assisted CVD method of the prior art at 1000° C. was assessed to obtain results shown in Table 5. The chlorine content and preferred orientation of each of these films were the same as the results of Tables 1 and 2, but no η phase was found at the edge ridge line part in any Samples. As to the film thickness, only the thickness of titanium carbonitride in the inner layer of Sample I 3 was 6 μm and the others were the same as the results of Table 1.

From these results, it is apparent that in Comparative Sample I 3, the wear resistance of the film is insufficient the film is stripped due to the increased chlorine content of the inner layer and the increased chlorine content of the titanium nitride in contact with the substrate and titanium carbonitride directly above it. Breakage of the film in the coating layer is also observed because the preferred orientation of the titanium carbonitride layer is outside the scope of the present invention. In contrast, Samples A3, C3, E3, P3 and Q3 of the present invention are more excellent in wear resistance, stripping resistance and breakage resistance in film.

Cutting Conditions 3

Workpiece: FC 25
Cutting Speed: 500 m/min
Cutting Depth: 1.5 mm
Cutting Oil: no
Feed: 0.25 mm/rev
Cutting time: 30 minutes -continued Cutting Conditions 4

Workpiece: FC 25
Cutting Speed: 400 m/min  Feed: 0.3 mm/rev
Cutting Depth: 1.5 mm
Cutting time: 1 pass = 10 sec, repeated 300 times
Cutting Oil: no

TABLE 5

| | Cutting Conditions 3 | Cutting Conditions 4 | | |
|---|---|---|---|---|
| Sample | Average Flank Wear Width (mm) | Average Flank Wear Width (mm) | Stripping of Coating Layer | Breakage in Film |
| A3 | 0.253 | 0.265 | no | no |
| C3 | 0.271 | 0.258 | no | no |
| E3 | 0.236 | 0.247 | no | no |
| I3 | 0.400 | stripping → broken | yes (much) | yes (much) |
| P3 | 0.272 | 0.260 | no | no |
| Q3 | 0.273 | 0.265 | no | no |

EXAMPLE 4

Using an aluminum oxide-based ceramics with a shape of CNMG 120408 as a substrate, coating layers having the same structures as A1, C1, E1, P1 and Q1 shown in Table 1 were formed on the surface thereof to prepare Samples A4, C4, E4, P4 and Q4 and subjected to assessment under the same conditions as Cutting Conditions 3 and 4 of Example 3. The results are shown in Table 6.

For comparison, Sample I 4 having the same film structure as A1 of Table 1, which was formed by coating the aluminum oxide-based ceramics substrate by the heat-assisted CVD method of the prior art at 1000° C., was assessed to obtain results shown in Table 6. The chlorine content and preferred orientation of each of these films were the same as the results of Tables 1 and 2, but no η phase was found at the edge ridge line part in any Samples. As to the film thickness, only the thickness of titanium carbonitride in the inner layer of Sample I 4 was 6 μm and the others were the same as the results of Table 1.

From these results, it is apparent that in Comparative Sample I 4, the wear resistance of the film is insufficient, causing an end breakage and stripping of the film due to the increased chlorine content of the inner layer and the increased chlorine content of the titanium nitride in contact with the substrate and titanium carbonitride directly above it. Breakage of the film in the coating layer is observed because the preferred orientation of the titanium carbonitride layer is outside the scope of the present invention. In contrast, Samples A4, C4, E4, P4 and Q4 of the present invention are more excellent in wear resistance, stripping resistance and breakage resistance in film.

TABLE 6

| Sample | Cutting Conditions 3 Average Flank Wear Width (mm) | Cutting Conditions 4 Average Flank Wear Width (mm) | Stripping of Coating Layer | Breakage in Film |
|---|---|---|---|---|
| A4 | 0.155 | 0.160 | no | no |
| C4 | 0.165 | 0.155 | no | no |
| E4 | 0.148 | 0.152 | no | no |
| I4 | end breakage | broken | yes (much) | yes (much) |
| P4 | 0.166 | 0.157 | no | no |
| Q4 | 0.168 | 0.154 | no | no |

EXAMPLE 5

Using a tungsten carbide-based cemented carbide with a shape of ISO P30 CNMG 120408 as a substrate, coating of the surface thereof was carried out at 1000° C. under the same gas conditions as in Example 1 to prepare Samples J1 to L1 having the film structures of the thick films as shown in Table 7. Sample J 1 after coated was then subjected to a shot peening treatment using iron powder to prepare Sample J 2 having the residual tensile stress reduced to zero in the coating layer.

For comparison, Comparative Samples M and N each having a film thickness exceeding the scope of the present invention and Comparative Sample O, in which an inner layer of titanium carbonitride was coated at 1000,° C. by the heat-assisted CVD method of the prior art to give the same thickness as Samples of the present invention, were respectively prepared and shown in Table 7.

As to these samples, the chlorine content in the film, the preferred orientation of the titanium carbonitride directly above titanium nitride in contact with the substrate and the deposition thickness of η phase at the edge ridge line part are shown in Table 8.

These samples were subjected to working under the following conditions 5 and 6 to obtain results shown in Table 9. It will be understood from these results that in Comparative Sample M, the film thickness of titanium carbonitride in the inner layer is larger and the preferred orientation is outside the scope of the present invention, which teach that stripping takes place in the coating layer and wear proceeds, and in Comparative Sample N, the whole thickness exceeds the scope of the present invention, which teaches that breakage often occurs in the coating layer. Moreover, Comparative Sample O by the heat-assisted CVD method of the prior art is no good use. In comparison with Samples J1 and J2 of the present invention, it is apparent that a treatment for removal of the residual stress after coating is effective for improving the stripping resistance and breakage resistance in film in such a thick film range.

Cutting Conditions 5

Workpiece: SCM 415 (HB = 210)
Cutting Speed: 500 m/min        Feed: 0.20 mm/rev
Cutting Depth: 1.5 mm           Cutting time: 30 minutes
Cutting Oil: water-soluble Cutting Conditions 6

Workpiece: SCM 415 (HB = 180)
Cutting Speed: 600 m/min        Feed: 0.15 min/rev
Cutting Depth: 1.5 mm
Cutting time: 1 pass = 10 sec, repeated 150 times
Cutting Oil: water-soluble

TABLE 7

| Sample | Film Structure and Film Thickness ($\mu$m) Outer Layer | Inner Layer | TiCN Film Thickness Just Above TiN Contacted with Substrate ($\mu$m) | Whole film Thickness of Coating Layer ($\mu$m) |
|---|---|---|---|---|
| J1 | TiN/TiCN/Al$_2$O$_3$ 5.0 25 50 | /TiCN/TiN/Sub. 19 1.0 | 19.0 | 100 |
| K1 | TiN/TiC /Al$_2$O$_3$ 5.0 3.0 60 | /TiBCN/TiC/TiCN/TiN/Sub. 0.5 10 20 0.5 | 20.0 | 99 |
| L1 | TiN/Al$_2$O$_3$ 0.5 85.5 | /TiBCN/TiCN/TiN/Sub. 0.5 10.0 2.0 | 10.0 | 98 |
| M | TiN/Al$_2$O$_3$ 2.0 3.0 | /TiCN/TiC/TiCN/TiN/Sub. 1.0 3.0 25 1.0 | 25.0 | 35 |
| N | TiN/ZrO$_2$ 5.0 80.0 | /TiBCN/TiCN/TiN/Sub. 1.0 20.0 0.5 | 20.0 | 106.5 |
| O | TiN/TiCN/Al$_2$O$_3$ 5.0 25 50 | /TiCN/TiN/Sub. 10.0 0.5 | 20.0 | 90.5 |

(Note)
M~O: Comparative Sample

TABLE 8

| Sample | Mean Cl Content of TiN Contacted with Sub. and TiCN just above TiN (at %) | Cl Content of Inner Layer (at. %) | I(311)/I(220) of TiCN just above TiN Contacted with Sub. 0–3 μm | I(311)/I(220) of TiCN just above TiN Contacted with Sub. 0–20 μm | Thickness of η Phase at Edge Ridge Line Part (μm) | I(111)/I(220) of TiCN just above TiN Contacted with Sub. 0–3 μm | I(111)/I(220) of TiCN just above TiN Contacted with Sub. 0–20 μm | [I(311)+I(111)]/I(220) of TiCN just above TiN Contacted with Sub. 0–3 μm | [I(311)+I(111)]/I(220) of TiCN just above TiN Contacted with Sub. 0–20 μm |
|---|---|---|---|---|---|---|---|---|---|
| J1 | 0.01 | 0.01 | 1.0 | 6.0(~19 μm) | 1.0 | 1.5 | 1.8 | 2.5 | 7.8 |
| K1 | 0.01 | 0.03 | 1.0 | 6.0(~20 μm) | 1.0 | 1.6 | 1.8 | 2.6 | 7.8 |
| L1 | 0.01 | 0.01 | 1.0 | 2.0(~10 μm) | 1.0 | 1.6 | 1.9 | 2.6 | 3.9 |
| M | 0.01 | 0.03 | 1.0 | 7.0(~20 μm) | 1.0 | 1.7 | 1.9 | 2.7 | 8.9 |
| N | 0.01 | 0.01 | 1.0 | 6.0(~20 μm) | 1.0 | 1.7 | 1.9 | 2.7 | 7.9 |
| O | 0.10 | 0.10 | 0.6 | 0.3(~20 μm) | 4.0 | 0.7 | 0.8 | 1.3 | 1.1 |

TABLE 9

| | Cutting Conditions 5 | Cutting Conditions 6 | | |
|---|---|---|---|---|
| Sample | Average Flank Wear Width (mm) | Average Flank Wear Width (mm) | Stripping of Coating Layer | Breakage in Film |
| J1 | 0.140 | 0.155 | very little | very little |
| K1 | 0.150 | 0.163 | very little | very little |
| L1 | 0.132 | 0.145 | very little | very little |
| J2 | 0.142 | 0.143 | no | no |
| M | 0.155 | 0.278 | yes (much) | very little |
| N | 0.143 | 0.246 | very little | yes (much) |
| O | broken for 2 minutes, | 10 passes, broken | very much | very much |

EXAMPLE 6

Using a tungsten carbide-based cemented carbide with a shape of CNMG 120408 of ISO P 10 as a substrate, coating layers having structures of a1 to h1 and p1 to r1 shown in Table 10 were formed on the surface thereof.

During the same time, formation of titanium carbonitride as a first layer was carried out at a temperature of 900 to 1100° C. as shown in Table 10 under gaseous conditions using a stream of mixed gases of 95% of $H_2$, 4% of titanium tetrachloride and 2% of acetonitrile ($CH_3CN$) at a furnace pressure of 60 Torr. The thickness of the coating layer was changed by changing the retention time.

The chlorine content in the film, preferred orientation and deposition thickness of η phase at the edge ridge line part of each of the products of the present invention are shown in Table 11. For comparison, Comparative Product i having the same film structure as Product a1 of the present invention, whose titanium carbonitride of the first layer was formed by the heat-assisted CVD method of the prior art using methane and $N_2$ as a carbon and nitrogen source at 1000° C., was prepared as shown in Table 11.

As to each of these samples, assessment of the wear resistance, the wear resistance including film stripping and the stripping breakage of the film itself was carried out under the following Cutting Conditions 7 and 8, thus obtaining results as shown in Table 12. From these results, it will be understood that Products a1 to h1 and p1 to r1 of the present invention are more excellent in wear resistance, stripping resistance and breakage resistance in film as compared with Comparative Product i.

In the products of the present invention, g1 exhibits a more residual chlorine content in the film and somewhat inferior wear resistance and stripping resistance, but is more improved in the breakage resistance in film as compared with Comparative Product i. This is an effect caused by maintaining the preferred orientation in the scope of the present invention.

Product h1 of the present invention exhibits a weak preferred orientation of (311) plane and somewhat inferior breakage resistance in film, but is more improved in wear resistance as compared with Comparative Product i, which is caused by bringing the residual chlorine content in the film into the scope of the present invention. In h1, the stripping resistance of the coating layer is somewhat inferior in spite of that the chlorine content in the film is small, which is probably due to the thickness of the η phase.

Cutting Conditions 7

Workpiece: SCM 415 (HB = 210)
Cutting Speed: 300 m/min          Feed: 0.35 mm/rev
Cutting Depth: 1.5 mm             Cutting time: 30 minutes
Cutting Oil: water-soluble
Cutting Conditions 8

Workpiece: SCM 415 (HB = 180)
Cutting Speed: 250 m/min          Feed: 0.3 mm/rev
Cutting Depth: 1.5 mm
Cutting time: 1 pass 10 sec, repeated 300 times
Cutting Oil: water-soluble

TABLE 10

| Sample | Temp. (°C.) | Film Structure and Film Thickness (μm) Outer Layer | Film Structure and Film Thickness (μm) Inner Layer | TiCN Film Thickness Just Above TiN Contacted with Substrate (μm) | Whole film Thickness of Coating Layer (μm) |
|---|---|---|---|---|---|
| a1 | 950 | TiN/TiCN/Al$_2$O$_3$ 0.5 0.5 2.0 | /TiCN/Sub. 8.0 | 8.0 | 11.0 |
| b1 | 950 | TiN/TiC /Al$_2$O$_3$ 0.5 0.5 2.0 | /TiBCN/TiC/TiCN/Sub. 0.5 3.0 1.0 | 1.0 | 7.5 |
| c1 | 1000 | TiN/Al$_2$O$_3$ 0.5 2.0 | /TiBCN/TiCN/Sub. 0.5 8.0 | 8.0 | 11.0 |
| d1 | 1000 | TiN/Al$_2$O$_3$ 2.0 3.0 | /TiCN/TiC/TiCN/Sub. 1.0 3.0 3.0 | 3.0 | 12.0 |
| e1 | 1050 | TiN/ZrO$_2$ 0.5 1.0 | /TiBCN/TiCN/Sub. 0.5 8.0 | 8.0 | 10.0 |
| f1 | 1050 | TiN/TiCN/HfO$_2$ 0.5 0.5 1.0 | /TiN/TiC/TiCN/Sub. 0.5 4.0 5.0 | 5.0 | 11.5 |
| g1 | 900 | TiN/TiCN/Al$_2$O$_3$ 0.5 0.5 2.0 | /TiCN/Sub. 8.0 | 8.0 | 11.0 |
| h1 | 1100 | TiN/TiCN/Al$_2$O$_3$ 0.5 0.5 2.0 | /TiCN/Sub. 8.0 | 8.0 | 11.0 |
| p1 | 1050 | TiN/Al$_2$O$_3$ 0.5 1.0 | /TiCN/Sub. 2.0 | 2.0 | 3.5 |
| q1 | 950 | TiN/Al$_2$O$_3$ 0.5 1.0 | /TiC/TiCN/Sub. 1.0 1.0 | 1.0 | 3.5 |
| r1 | 1060 | TiN/Al$_2$O$_3$ 0.5 1.0 | /TiCN/Sub. 2.0 | 2.0 | 3.5 |

TABLE 11

| Sample | Mean Cl Content of TiCN Contacted with Substrate (at %) | Cl Content of Inner Layer (at. %) | I(311)/I(220) of TiCN Contacted with Substrate 0–3 μm | I(311)/I(220) of TiCN Contacted with Substrate 0–20 μm | Thickness of η Phase at Edge Ridge Line Part (μm) | I(111)/I(220) of TiCN Contacted with Substrate 0–3 μm | I(111)/I(220) of TiCN Contacted with Substrate 0–20 μm | [I(311)+I(111)]/I(220) of TiCN Contacted with Sub. 0–3 μm | [I(311)+I(111)]/I(220) of TiCN Contacted with Sub. 0–20 μm |
|---|---|---|---|---|---|---|---|---|---|
| a1 | 0.04 | 0.04 | 1.5 | 2.5(~8 μm) | 0 | 3.0 | 7.0 | 4.5 | 9.5 |
| b1 | 0.03 | 0.05 | 0.5 | — | 0 | 1.5 | — | 2.0 | — |
| c1 | 0.01 | 0.01 | 1.0 | 1.5( ~8 μm) | 0.5 | 3.3 | 8.0 | 4.3 | 9.5 |
| d1 | 0.01 | 0.03 | 1.0 | — | 0.5 | 2.0 | — | 3.0 | — |
| e1 | 0.01 | 0.015 | 0.6 | 1.0( ~8 μm) | 1.0 | 1.4 | 1.5 | 2.0 | 2.5 |
| f1 | 0.01 | 0.04 | 0.6 | 0.9(~5 μm) | 1.0 | 3.5 | 2.0 | 4.1 | 2.9 |
| g1 | 0.15 | 0.15 | 1.5 | 5.5(~8 μm) | 0 | 1.0 | 1.4 | 2.5 | 6.9 |
| h1 | 0.01 | 0.01 | 0.7 | 0.45(~8 μm) | 2.0 | 1.2 | 1.4 | 1.9 | 1.85 |
| i | 0.10 | 0.10 | 0.4 | 0.35(~8 μm) | 3.5 | 0.3 | 0.3 | 0.7 | 0.65 |
| p1 | 0.05 | 0.06 | 0.2 | — | 0.5 | 1.7 | — | 1.9 | — |
| q1 | 0.05 | 0.07 | 1.5 | — | 0.5 | 0.3 | — | 1.8 | — |
| r1 | 0.05 | 0.06 | 0.2 | — | 0.5 | 1.0 | — | 1.8 | — |

TABLE 12

| Sample | Cutting Conditions 7 Average Flank Wear Width (mm) | Cutting Conditions 8 Average Flank Wear Width (mm) | Cutting Conditions 8 Stripping of Coating Layer | Cutting Conditions 8 Breakage in Film |
|---|---|---|---|---|
| a1 | 0.19 | 0.175 | no | no |
| b1 | 0.18 | 0.18 | no | no |
| c1 | 0.174 | 0.168 | no | no |
| d1 | 0.175 | 0.17 | no | no |
| e1 | 0.18 | 0.172 | no | no |
| f1 | 0.183 | 0.172 | no | no |
| g1 | 0.210 | 0.230 | yes (a little) | no |
| h1 | 0.185 | 0.270 | yes (much) | yes (somewhat much) |
| i | 0.225 | 0.350 | yes (much) | yes (much) |
| p1 | 0.210 | 0.230 | no | no |
| q1 | 0.215 | 0.225 | no | no |
| r1 | 0.213 | 0.228 | no | no |

EXAMPLE 7

Using a titanium carbonitride-based cermet with a shape of CNMG 120408 of ISO P 10 as a substrate, coating layers having the same structures as a1, c1 and e1 shown in Table 1 were formed on the surface thereof to prepare Samples a2, c2 and e2 and subjected to assessment under the same cutting conditions as Conditions 7 and 8 of Example 6. The results are shown in Table 13.

For comparison, Sample i 2 having the same film structure as a1 of Table 10, which was formed by coating the cermet substrate by the heat-assisted CVD method of the prior art at 1000° C., was assessed to obtain results shown in Table 4. The film thickness, chlorine content and preferred orientation of each of these films were the same as the results of Tables 10 and 11, but no η phase was found at the edge ridge line part in any Samples. (In only Sample i 2, deposition of a metallic phase, probably due to Ni of the binder, was found in the coating layer).

From these results, it is apparent that in Comparative Sample i 2, the wear resistance of the film is insufficient and stripping of the film occurs due to the increased chlorine content of the inner layer and the increased chlorine content of the first layer. Breakage of the film in the coating layer is observed because the preferred orientation of the first layer is outside the scope of the present invention. In contrast, Samples a2, c2 and e2 of the present invention are excellent in wear resistance, stripping resistance and breakage resistance in film.

For comparison, Sample i 3 having the same film structure as a1 of Table 10, which was formed by coating the silicon nitride type ceramics substrate by the heat-assisted CVD method of the prior art at 1000° C., was assessed to obtain results shown in Table 14. The chlorine content and preferred orientation of each of these films were the same as the results of Tables 10 and 11, but no η phase was found at the edge ridge line part in any Samples. As to the film thickness, only the thickness of titanium carbonitride as the first layer of Sample i 3 was 6 μm and the others were the same as the results of Table 10.

From these results, it is apparent that in Comparative Sample i 3, the wear resistance of the film is insufficient and stripping of the film occurs due to the increased chlorine content of the inner layer and the increased chlorine contents of the first layer. Breakage of the film is also observed in the coating layer because the preferred orientation of the first layer is outside the scope of the present invention. In contrast, Samples a3, c3 and e3 of the present invention are excellent in wear resistance, stripping resistance and breakage resistance in film.

Cutting Conditions 9

Workpiece: FC 25
Cutting Speed: 500 m/min    Feed: 0.25 mm/rev
Cutting Depth: 1.5 mm    Cutting time: 30 minutes
Cutting Oil: no

TABLE 13

| | Cutting Conditions 7 | Cutting Conditions 8 | | |
| --- | --- | --- | --- | --- |
| Sample | Average Flank Wear Width (mm) | Average Flank Wear Width (mm) | Stripping of Coating Layer | Breakage in Film |
| a2 | 0.165 | 0.180 | no | no |
| c2 | 0.168 | 0.175 | no | no |
| e2 | 0.169 | 0.169 | no | no |
| i2 | 0.240 | broken | yes (much) | yes (much) |

EXAMPLE 8

Using a silicon nitride type ceramics with a shape of CNMG 120408 as substrate, coating layers having the same structures as a1, c1 and e1 shown in Table 1 were formed on the surface thereof to prepare Samples a3, c3 and e3 and subjected to assessment under the following Cutting Conditions 9 and 10. The results are shown in Table 14.

Cutting Conditions 10

Workpiece: FC 25
Cutting Speed: 400 m/min    Feed: 0.3 mm/rev
Cutting Depth: 1.5 mm
Cutting time: 1 pass = 10 sec, repeated 300 times
Cutting Oil: no

TABLE 14

| | Cutting Conditions 9 | Cutting Conditions 10 | | |
| --- | --- | --- | --- | --- |
| Sample | Average Flank Wear Width (mm) | Average Flank Wear Width (mm) | Stripping of Coating Layer | Breakage in Film |
| a3 | 0.250 | 0.264 | no | no |
| c3 | 0.265 | 0.256 | no | no |
| e3 | 0.234 | 0.245 | no | no |
| i3 | 0.386 | stripping → broken | yes (much) | yes (much) |

EXAMPLE 9

Using an aluminum oxide-based ceramics with a shape of CNMG 120408 as substrate, coating layers having the same structures as a1, c1 and e1 shown in Table 10 were formed on the surface thereof to prepare Samples a4, c4 and e4 and subjected to assessment under the same conditions as Cutting Conditions 9 and 10 of Example 8. The results are shown in Table 15.

For comparison, Sample i 4 having the same film structure as a1 of Table 10, which was formed by coating the aluminum oxide-based ceramics substrate by the heat-assisted CVD method of the prior art at 1000° C., was assessed to obtain results shown in Table 15. The chlorine content and preferred orientation of each of these films were the same as the results of Tables 10 and 11, but no η phase was found at the edge ridge line part in any Samples. As to the film thickness, only the thickness of titanium carbonitride as the first layer of Sample i 4 was 6 μm and the others were the same as the results of Table 10.

From these results, it is apparent that in Comparative Sample i 4, the wear resistance of the film is insufficient, causing an end breakage, and stripping of the film occurs due to the increased chlorine content of the inner layer and the increased chlorine content of the first layer. Breakage of the film in the coating layer is observed because the preferred orientation of the first layer is outside the scope of the present invention. In contrast, Samples a4, c4 and e4 of the present invention are excellent in wear resistance, stripping resistance and breakage resistance in film.

invention and Comparative Sample o, in which titanium carbonitride of the first layer was coated at 1000, °C. by the heat-assisted CVD method of the prior art using C and $N_2$ as a carbon and nitrogen source to give the same thickness as Samples of the present invention, were respectively prepared and shown in Table 16.

As to these samples, the chlorine content in the film, the preferred orientation of the titanium carbonitride as the first layer and the deposition thickness of η phase at the edge ridge line part are shown in Table 17.

These samples were subjected to working under the following conditions 11 and 12 to obtain results shown in Table 18. It will be understood from these results that in Comparative Sample m, the film thickness of titanium carbonitride of the first layer is larger and the preferred orientation is outside the scope of the present invention, which teach that stripping takes place in the coating layer and wear proceeds, and in Comparative Sample n, the whole thickness exceeds the scope of the present invention, which teaches that breakage often occurs in the coating layer. Moreover, Comparative Sample o by the heat-assisted CVD method of the prior art is no good use. In comparison with Samples j1 and j2 of the present invention, it is apparent that a treatment for removal of the residual stress after coating is effective for improving the stripping resistance and breakage resistance in film in such a thick film range.

TABLE 15

| | Cutting Conditions 9 | Cutting Conditions 10 | | |
|---|---|---|---|---|
| Sample | Average Flank Wear Width (mm) | Average Flank Wear Width (mm) | Stripping of Coating Layer | Breakage in Film |
| a4 | 0.150 | 0.165 | no | no |
| c4 | 0.162 | 0.159 | no | no |
| e4 | 0.149 | 0.155 | no | no |
| i4 | end breakage | broken | yes (much) | yes (much) |

EXAMPLE 10

Using a tungsten carbide-based cemented carbide with a shape of ISO P30 CNMG 120408 as a substrate, coating of the surface thereof was carried out at 1000° C. under the same gas conditions as in Example 6 to prepare Samples j1 to I1 having the film structures of thick films as shown in Table 16. Sample j1 thus coated was then subjected to a shot peening treatment using iron powder to prepare Sample j 2 having the residual tensile stress reduced to zero in the coating layer.

For comparison, Comparative Samples in and n each having a film thickness exceeding the scope of the present Cutting Conditions 11

Workpiece: SCM 415 (HB = 210)
Cutting Speed: 500 m/min      Feed: 0.20 mm/rev
Cutting Depth: 1.5 mm          Cutting time: 30 minutes
Cutting Oil: water-soluble
Cutting Conditions 12

Workpiece: SCM 415 (HB = 180)
Cutting Speed: 600 m/min      Feed: 0.15 mm/rev
Cutting Depth: 1.5 mm
Cutting time: 1 pass = 10 sec, repeated 150 times
Cutting Oil: water-soluble

TABLE 16

| | Film Structure and Film Thickness (μm) | | Thickness of TiCN Film Contacted with Substrate (μm) | Whole film Thickness of Coating Layer (μm) |
|---|---|---|---|---|
| Sample | Outer Layer | Inner Layer | | |
| j1 | TiN/TiCN/Al$_2$O$_3$ 5.0 25 50 | /TiCN/Sub. 20 | 20.0 | 100 |
| k1 | TiN/TiC/Al$_2$O$_3$ 5.0 3.0 60 | /TiBCN/TiC/TiCN/Sub. 0.5 10 20 | 20.0 | 98.5 |

TABLE 16-continued

| | Film Structure and Film Thickness ($\mu$m) | | Thickness of TiCN Film Contacted with Substrate ($\mu$m) | Whole film Thickness of Coating Layer ($\mu$m) |
|---|---|---|---|---|
| Sample | Outer Layer | Inner Layer | | |
| l1 | TiN/Al$_2$O$_3$ 0.5 85.0 | /TiBCN/TiCN/Sub. 0.5 10.0 | 10.0 | 96.0 |
| m | TiN/Al$_2$O$_3$ 2.0 3.0 | /TiCN/TiC/TiCN/Sub. 1.0 3.0 25 | 25.0 | 34.0 |
| n | TiN/ZrO$_2$ 5.0 80.0 | /TiBCN/TiCN/Sub. 1.0 20.0 | 20.0 | 106 |
| o | TiN/TiCN/Al$_2$O$_3$ 5.0 25 50 | /TiCN/Sub. 10.0 | 20.0 | 90 |

(Note)
M~O: Comparative Sample

TABLE 17

| | Mean Chlorine Content of TiCN Contacted with Substrate | Chlorine Content of Inner Layer | I(311)/I(220) of TiCN Contacted with Substrate | | Thickness of $\eta$ Phase at Edge Ridge Line Part |
|---|---|---|---|---|---|
| Sample | (at %) | (at %) | 0~3 $\mu$m | ~20 $\mu$m | ($\mu$m) |
| j1 | 0.01 | 0.01 | 1.0 | 6.0 | 1.0 |
| k1 | 0.01 | 0.03 | 1.0 | 6.0 | 1.0 |
| l1 | 0.01 | 0.01 | 1.0 | 2.0 | 1.0 |
| m | 0.01 | 0.03 | 1.0 | 7.0 | 1.0 |
| n | 0.01 | 0.01 | 1.0 | 6.0 | 1.0 |
| o | 0.10 | 0.10 | 0.6 | 0.3 | 4.0 |

TABLE 18

| | Cutting Conditions 11 | Cutting Conditions 12 | | |
|---|---|---|---|---|
| | Average Flank Wear Width (mm) | Average Flank Wear Width (mm) | Stripping of Coating Layer | Breakage in Film |
| j1 | 0.144 | 0.150 | very little | very little |
| k1 | 0.155 | 0.162 | very little | very little |
| l1 | 0.135 | 0.142 | very little | very little |
| j2 | 0.145 | 0.149 | no | no |
| m | 0.160 | 0.270 | yes (much) | very little |
| n | 0.145 | 0.245 | very little | yes (much) |
| o | broken in 2 min. | 10 passes, broken | very much | very much |

EXAMPLE 11

Using a tungsten carbide-based cemented carbide with a shape of ISO P30 CNMG 120408 as a substrate, coating of the surface thereof was carried out by forming coating layers each having a structure of TiN (0.5 $\mu$m)/Al$_2$O$_3$ (2.0 $\mu$m)/TiBCN (0.5 $\mu$m)/TiC (3 $\mu$m)/TiCN (6 $\mu$m)/Substrate (outer layer: upper TiN and Al$_2$O$_3$) to prepare Samples X1 to X5, and by forming coating layers each having a structure of TiN (0.5 $\mu$m)/Al$_2$O$_3$ (2.0 $\mu$m)/TiBCN (0.5$\mu$m)/TiC (3$\mu$m)/TiCN (6 $\mu$m)/TiN (0.5 $\mu$m)/Substrate (outer layer: upper TiN and Al$_2$O$_3$) to prepare Samples Y1 to Y5. Herein, the formation of TiN contacted with the substrate of Y1 to Y5 was carried out in a mixed gaseous stream of 1% of titanium tetrachloride, 50% of nitrogen (N$_2$) and the balance of hydrogen (H$_2$) at 900° C.

The formation of titanium carbonitride of the inner layer in X1 to X5 and Y1 to Y5 was respectively carried out at 800, 850, 900, 940 and 1050° C. in this order in mixed gaseous streams of 4% of titanium tetrachloride, 26 to 60% of N$_2$, 0.4 to 1% of acetonitrile and the balance of H$_2$. The thickness of the coating layer was controlled to the above described film thickness by changing the retention time. The mean chlorine content in TiCN and TiN of the inner layer was 0.1 to 0.15% in the case of X1 to X4 and Y1 to Y4 and at most 0.05% in the case of X5 and Y5. The preferred orientation in the film of the present invention is shown in Table 19.

The above described procedures were repeated to give the same film structures but changing the forming conditions in 0.1% of acetonitrile, 790° C. and 0% of N$_2$ to prepare Comparative Samples Z1 (with the same film structure as X1 to X5) and Z2 (with the same film structure as Y1 to Y5) and the orientation property thereof is also shown in Table 19. In both the cases of Z1 and Z2, the chlorine contents in TiCN and TiN exceeded 0.2%.

These samples were subjected to working under the following Cutting Conditions 13 and 14 to obtain results shown in Table 20. It is apparent from these results that the products of the present invention, X1 to X5 and Y1 to Y5 are more well-balanced and improved in wear resistance, stripping resistance and breakage resistance in film as compared with Z1 and Z2, which teach the benefit of the present invention by controling the preferred orientation in the scope of the present invention.

Cutting conditions 13

Workpiece: SCM 435 (HB = 230)
Cutting Speed: 160 m/min      Feed: 00.35 mm/rev
Cutting Depth: 1.5 min         Cutting time: 30 minutes
Cutting Oil: water-soluble
Cutting Conditions 14

Workpiece: SCM 415 (HB = 140)
Cutting Speed: 350 m/min      Feed: 0.35 mm/rev
Cutting Depth: 1.5 mm
Cutting time: 1 pass = 10 sec, repeated 500 times
Cutting Oil: water-soluble

EXAMPLE 12

Using a titanium carbonitride-based cermet with a shape of CNMG 120408 of ISO P 10 as a substrate, coating layers having the same structures were formed on the surface thereof under the same conditions as in the case of X1, X4, Y1 and Y4 (samples of present invention) and Z1 and Z2 of Table 19 to prepare Samples X6, X7, Y6, Y7, Z3 and Z4, which were then subjected to assessment under the same conditions, i.e. Cutting Conditions 13' and 14' as Cutting Conditions 13 and 14 of Example 11 but changing the cutting depth in 0.5 mm, thus obtaining results shown in Table 21.

The preferred orientation of the coating layers and the chlorine contents in the films were the same as those of Samples of Example 11. Consequently, it is apparent that the samples of the present invention are more well-balanced and improved in wear resistance, stripping resistance and breakage resistance in film as compared with the comparative samples.

TABLE 19

| Sample | I(hkl)/J(220) of TiCN Contacted with Substrate | | I(311)/I(220) of TiCN Contacted with Substrate | | I(111)/I(220) of TiCN Contacted with Substrate | | [I(311) + I(111)]/ I(220) of TiCN Contacted with Sub. | |
|---|---|---|---|---|---|---|---|---|
| | 0–3 µm | 0–6 µm | 0–3 µm | 0–6 µm | 0–3 µm | 0–6 µm | 0–3 µm | 0–6 µm |
| X1 | 2.5 | 2.5 | 0.3 | 0.3 | 0.8 | 0.8 | 1.1 | 1.1 |
| X2 | 3.3 | 3.8 | 0.5 | 0.5 | 0.8 | 0.8 | 1.3 | 1.3 |
| X3 | 4.0 | 5.0 | 0.4 | 0.4 | 1.0 | 1.0 | 1.4 | 1.4 |
| X4 | 3.5 | 3.8 | 1.0 | 1.0 | 1.0 | 1.0 | 2.0 | 2.0 |
| X5 | 7.0 | 8.5 | 0.4 | 0.4 | 0.9 | 0.9 | 1.3 | 1.3 |
| Y1 | 2.5 | 2.5 | 0.3 | 0.4 | 0.8 | 0.9 | 1.1 | 1.3 |
| Y2 | 3.3 | 3.8 | 0.5 | 0.5 | 0.8 | 0.9 | 1.3 | 1.4 |
| Y3 | 4.0 | 5.0 | 0.3 | 0.4 | 1.0 | 1.0 | 1.3 | 1.4 |
| Y4 | 3.5 | 3.8 | 1.0 | 1.0 | 1.0 | 1.0 | 2.0 | 2.0 |
| Y5 | 7.0 | 8.5 | 0.3 | 0.4 | 0.8 | 0.9 | 1.1 | 1.3 |
| Z1 | 2.0 | 2.3 | 0.2 | 0.2 | 0.7 | 0.8 | 0.9 | 1.0 |
| Z2 | 1.8 | 2.2 | 0.2 | 0.3 | 0.6 | 0.8 | 0.8 | 1.1 |

TABLE 20

| | Cutting Conditions 13 | Cutting Conditions 14 | | |
|---|---|---|---|---|
| Sample | Average Flank Wear Width (mm) | Average Flank Wear Width (mm) | Stripping of Coating Layer | Breakage in Film |
| X1 | 0.225 | 0.185 | yes (a little) | no |
| X2 | 0.230 | 0.188 | yes (a little) | no |
| X3 | 0.226 | 0.179 | yes (a little) | no |
| X4 | 0.213 | 0.180 | no | no |
| X5 | 0.215 | 0.182 | no | no |
| Y1 | 0.228 | 0.188 | yes (a little) | no |
| Y2 | 0.226 | 0.186 | yes (a little) | no |
| Y3 | 0.220 | 0.190 | yes (a little) | no |
| Y4 | 0.213 | 0.179 | no | no |
| Y5 | 0.220 | 0.169 | no | no |
| Z1 | 0.250 | 0.280 | yes (much) | yes (much) |
| Z2 | 0.258 | 0.310 | yes (much) | yes (much) |

TABLE 21

| Sample | Cutting Conditions 13' Average Flank Wear Width (mm) | Cutting Conditions 14' | | |
|---|---|---|---|---|
| | | Average Flank Wear Width (mm) | Stripping of Coating Layer | Breakage in Film |
| X6 | 0.195 | 0.172 | yes (a little) | no |
| X7 | 0.183 | 0.175 | no | no |
| Y6 | 0.200 | 0.175 | yes (a little) | no |
| Y7 | 0.202 | 0.179 | no | no |
| Z3 | 0.223 | 0.235 | yes (much) | yes (much) |
| Z4 | 0.241 | 0.260 | yes (much) | yes (much) |

EXAMPLE 13

Using a silicon nitride type ceramics with a shape of CNMG 120408 as a substrate, coating layers having the same structures were formed on the surface thereof under the same conditions as in the case of X1, X4, Y1 and Y4 (samples of present invention) and Z1 and Z2 of Table 19 to prepare Samples X8, X9, Y8, Y9, Z5 and Z6, which were then subjected to assessment under Cutting Conditions 15 and 16, thus obtaining results shown in Table 22.

The preferred orientation of the coating layers and the chlorine contents in the films were the same as those of Samples of Example 11. Consequently, it is apparent that the samples of the present invention are more well-balanced and improved in wear resistance, stripping resistance and breakage resistance in film as compared with the comparative samples.

EXAMPLE 14

Using a whisker-containing alumina-based ceramics with a shape of SNMN 120408 as a substrate, coating layers having the same structures were formed on the surface thereof under the same conditions as in the case of X1, X4, Y1 and Y4 (samples of present invention) and Z1 and Z2 of Table 19 to prepare Samples X10, X11, Y10, Y11, Z7 and Z8, which were then subjected to assessment under Cutting Conditions 17 and 18, thus obtaining results shown in Table 23.

The preferred orientation of the coating layers and the chlorine contents in the films were the same as those of Samples of Example 11. Consequently, it is apparent that the samples of the present invention are more well-balanced and improved in wear resistance, stripping resistance and breakage resistance in film as compared with the comparative samples.

Cutting Conditions 15

Workpiece: FC 25
Cutting Speed: 600 m/min    Feed: 0.30 mm/rev
Cutting Depth: 1 mm    Cutting time: 30 minutes
Cutting Oil: no Cutting Conditions 16

Workpiece: FC 25
Cutting Speed: 300 m/min    Feed: 0.30 mm/rev
Cutting Depth: 1.5 mm
Cutting time: 1 pass = 5 sec, repeated 500 times
Cutting Oil: no Cutting Conditions 17

Workpiece: FCD 70
Cutting Speed: 350 m/min    Feed: 0.30 mm/rev
Cutting Depth: 1 mm    Cutting time: 30 minutes
Cutting Oil: no Cutting Conditions 18

Workpiece: FCD 70
Cutting Speed: 250 m/min    Feed: 0.30 mm/rev
Cutting Depth: 1.5 mm
Cutting time: 1 pass = 5 sec, repeated 500 times
Cutting Oil: no

TABLE 22

| Sample | Cutting Conditions 15 Average Flank Wear Width (mm) | Cutting Conditions 16 | | |
|---|---|---|---|---|
| | | Average Flank Wear Width (mm) | Stripping of Coating Layer | Breakage in Film |
| X8 | 0.250 | 0.188 | yes (a little) | no |
| X9 | 0.236 | 0.185 | no | no |
| Y8 | 0.251 | 0.199 | yes (a little) | no |
| Y9 | 0.244 | 0.191 | no | no |
| Z5 | 0.289 | 0.255 | yes (much) | yes (much) |
| Z6 | 0.293 | 0.249 | yes (much) | yes (much) |

TABLE 23

| Sample | Cutting Conditions 17 Average Flank Wear Width (mm) | Cutting Conditions 18 Average Flank Wear Width (mm) | Stripping of Coating Layer | Breakage in Film |
|---|---|---|---|---|
| X10 | 0.270 | 0.225 | yes (a little) | no |
| X11 | 0.255 | 0.211 | no | no |
| Y10 | 0.268 | 0.239 | yes (a little) | no |
| Y11 | 0.249 | 0.225 | no | no |
| Z7 | 0.350 | 0.292 | yes (much) | yes (much) |
| Z8 | 0.366 | 0.296 | yes (much) | yes (much) |

EXAMPLE 15

Using a tungsten carbide-based cemented carbide with a shape of ISO P30 CNMG 120408 as a substrate, coating of the surface thereof was carried out by forming coating layers each having a structure of TiN (0.5 $\mu$m)/Al$_2$O$_3$ (3.0 $\mu$m)/ TiBCN (0.5 $\mu$m)/TiCN (20 $\mu$m)/Substrate (outer layer: upper TiN and Al$_2$O$_3$) to prepare Samples X12 to X13, and by forming coating layers each having a structure of TiN (0.5 $\mu$m)/Al$_2$O$_3$ (2.0 $\mu$m)/TiBCN (0.5 $\mu$m)/TiCN (20 $\mu$m)/ TiN (0.5 $\mu$m)/Substrate (outer layer: upper TiN and Al$_2$O$_3$) to prepare Samples Y12 to Y13. Herein, the formation of TiN contacted with the substrate of Y12 to Y13 was carried out in a mixed gaseous stream of 1% of titanium tetrachloride, 45% of nitrogen (N$_2$), 5% of ammonia (NH$_3$) and the balance of hydrogen (H$_2$) at 750° C.

The formation of titanium carbonitride of the inner layer in X12 to X13 and Y12 to Y13 was respectively carried out at 800 and 950° C. in this order in mixed gaseous streams of 4% of titanium tetrachloride, 26% of N$_2$, 0.4 to 1% (variable) of acetonitrile and the balance of H$_2$. The thickness of the coating layer was controlled to the above described film thickness by changing the retention time. The mean chlorine content in TiCN and TiN of the inner layer was 0.1 to 0.15% in the case of X12 and Y12 and at most 0.05% both on average of TiCN and TiN and on average of the inner layer in the case of X 13 and Y13. The preferred orientation in the film of the present invention is shown in Table 24.

The preferred orientation of films of Comparative Samples Z9 (with the same film structure as X6) and Z10 (with the same film structure as Y6), which are prepared by adjusting the TiCN-forming conditions to the use of 10% of methane (CH$_4$), 5% of nitrogen (N$_2$), 1% of titanium tetrachloride and the balance of hydrogen (H$_2$) at 1000° C. and to give the same film structure, is also shown in Table 24.

These samples were subjected to working under the following Cutting Conditions 19 and 20 to obtain results shown in Table 25. It is apparent from these results that the products of the present invention, X12 to X13 and Y12 to Y13 are more well-balanced and improved in wear resistance, stripping resistance and breakage resistance in film as compared with Z9 and Z10, which teach the benefit of the present invention by controling the preferred orientation in the scope of the present invention.

Cutting Conditions 19

Workpiece: SCM 415 (HB = 200)
Cutting Speed: 150 m/min          Feed: 0.35 min/rev
Cutting Depth: 1.5 mm             Cutting time: 30 minutes
Cutting Oil: water-soluble Cutting Conditions 20

Workpiece: SCM 415 (HB = 140)
Cutting Speed: 300 m/min          Feed: 0.35 mm/rev
Cutting Depth: 1.5 mm
Cutting time: 1 pass = 5 sec, repeated 1000 times
Cutting Oil: water-soluble

TABLE 24

| | I(hkl)/I(220) of TiCN Contacted with Substrate | | I(311)/I(220) of TiCN Contacted with Substrate | | I(111)/I(220) of TiCN Contacted with Substrate | | [I(311) + I(111)]/ I(220) of TiCN Contacted with Sub. | |
|---|---|---|---|---|---|---|---|---|
| Sample | 0–3 $\mu$m | 0–6 $\mu$m | 0–3 $\mu$m | 0–6 $\mu$m | 0–3 $\mu$m | 0–6 $\mu$m | 0–3 $\mu$m | 0–6 $\mu$m |
| X12 | 7.0 | 15.0 | 1.5 | 6.0 | 4.0 | 8.0 | 5.5 | 14.0 |
| X13 | 7.0 | 15.0 | 1.5 | 5.5 | 3.5 | 8.0 | 5.0 | 13.5 |
| Y12 | 7.0 | 15.0 | 1.0 | 6.0 | 3.0 | 8.0 | 4.0 | 14.0 |
| Y13 | 7.0 | 15.0 | 1.0 | 5.4 | 2.8 | 7.5 | 3.8 | 12.9 |
| Z9 | 2.0 | 2.4 | 0.2 | 0.3 | 0.1 | 0.3 | 0.3 | 0.6 |
| Z10 | 1.8 | 2.0 | 0.1 | 0.2 | 0.1 | 0.2 | 0.2 | 0.4 |

TABLE 25

| Sample | Cutting Conditions 19 Average Flank Wear Width (mm) | Cutting Conditions 20 Average Flank Wear Width (mm) | Stripping of Coating Layer | Breakage in Film |
|---|---|---|---|---|
| X12 | 0.236 | 0.184 | yes (a little) | no |
| X13 | 0.215 | 0.172 | no | no |
| Y12 | 0.244 | 0.190 | yes (a little) | no |
| Y13 | 0.220 | 0.177 | no | no |
| Z9 | 0.256 | 0.290 | yes (much) | yes (much) |
| Z10 | 0.245 | 0.266 | yes (much) | yes (much) |

EXAMPLE 16

Structure of Inner Layer

On a surface of a tungsten carbide-based cemented carbide (ISO P10) with a shape of CNMG 120408 were formed a titanium nitride film with a thickness of 0.6 μm by a known heat-assisted CVD method and then a titanium carbonitride film by a MT-CVD method.

The titanium carbonitride-forming conditions were adjusted to 2% of $TiCl_4$, 1% of $CH_3CN$, 90% of $H_2$ and the balance of Ar (molar flow rate), a total flow rate of 20 liter/min, substrate temperature of 900° C. and reactor pressure of 72 Torr. The thickness of the titanium carbonitride is varied by controlling the film-forming time.

On the titanium carbonitride film of the second layer were further laminated a titanium boronitride film and alumina film in this order by the known heat-assisted CVD method to obtain the coated cutting tool of the present invention.

As to the resulting titanium carbonitride film, the film thickness, average crystal grain diameter, hardness and presence or absence of the boundary etched layer were measured to obtain results shown in Table 26.

Measurement of the average crystal grain diameter is generally carried out by polishing and smoothening a grown surface of a film and simultaneously removing an alumina film and titanium nitride film on the surface, etching with a mixed solution of hydrofluoric acid, nitric acid and distilled water to emboss a crystal grain boundary of titanium carbonitride film and observing it by the use of a scanning electron microscope, followed by measuring by the above described methods.

The hardness of a titanium carbonitride film is measured by polishing and smoothening the grown surface of the film and then using a Knoop hardness meter (load: 25 g, loading time: 20 seconds). The unit of hardness is $kgf/mm^2$.

For comparison, there are also described cases where undercoated titanium nitride is not provided (Sample 6) and where a titanium carbonitride film is formed by an MT-CVD method using no Ar (Sample 7). In any case, a titanium boronitride and alumina film were laminated in this order by the known heat-assisted CVD method. In addition, it was confirmed by an X-ray photoelectron spectroscopic method (XPS) and X-ray diffraction method that component x in the resulting $TiC_xN_{1-x}$ was about 0.6 in all cases.

TABLE 26

| Sample No. | Thickness of TiCN Film (μm) | Grain Diameter of TiCN Film (μm) | Hardness of TiCN Film | Presence or Absence of Interfacial Etched Layer |
|---|---|---|---|---|
| 1 | 1.4 | 0.54 | 1950 | no |
| 2 | 3.5 | 0.96 | 1860 | no |
| 3 | 5.1 | 1.34 | 2130 | no |
| 4 | 10.7 | 1.83 | 2010 | no |
| 5 | 18.5 | 2.73 | 2210 | no |
| 6 | 5.2 | 1.72 | 2080 | yes |
| 7 | 5.8 | 3.23 | 2440 | no |

(Note) Sample Nos. 6–7: Comparative Samples

From Table 26, it will be understood that in Sample 6 free from the undercoated titanium nitride film, an etched layer is formed at the interface between the substrate and film and the titanium carbonitride of Sample 7, formed by the MT-CVD method using no Ar, has a large crystal grain diameter and high hardness.

It has not been clarified why, when Ar is added to a raw material gas for the MT-CVD method, the growth behaviour of the columnar crystal is changed to suppress the increase of the average crystal grain diameter with the growth of the film and to lower the hardness of the titanium carbonitride film, as is evident from Samples 1 to 5 according to the present invention. Moreover, it is confirmed by the inventors that the same phenomenon can be found in the formation of the titanium carbonitride by the MT-CVD method adding nitrogen gas instead of Ar, which will not be illustrated in detail in the description.

Samples 3, 6 and 7 having similar film thicknesses, of the Samples shown in Table 26, were subjected to a cutting test under the conditions shown in Table 27 to obtain results shown in Table 28. In this test, assessment was carried out concerning the wear resistance of the titanium carbonitride film, adhesiveness between the inner layer (titanium nitride film in contact with the substrate and titanium carbonitride film directly thereon) and the substrate, and breakage resistance in film.

TABLE 27

| Items | Cutting Conditions 21 |
|---|---|
| Workingpiece | SCM 415 |
| Cutting Speed (m/min) | 250 |
| Feed (mm/rev) | 0.3 |
| Cutting Depth (mm) | 1.5 |

TABLE 27-continued

| Items | Cutting Conditions 21 |
|---|---|
| Cutting Oil | water-soluble |
| Cutting Time | 1 pass = 10 sec., repeated 300 times |

TABLE 28

| Sample No. | Average Flank Wear (mm) | Presence or Absence of Stripping | Breakage of Cutting Edge |
|---|---|---|---|
| 3 | 0.12 | no | no |
| 6 | 0.18 | yes | no |
| 7 | 0.14 | no | yes |

It is apparent from Table 28 that the samples of of the present invention are excellent in wear resistance, stripping resistance and breakage resistance. On the other hand, Sample 6 free from the undercoated titanium nitride film is inferior in stripping resistance of the film. This is considered due to formation of the etched layer at the interface with the substrate. In a case where the average crystal grain diameter of the titanium carbonitride film is larger (Comparative Example 2), there is obtained the titanium carbonitride film of type 3, as described above, having substantially good wear resistance as well as good stripping resistance, but tending to be broken at the edge part and to cause abnormal wear or dispersion of the service life.

EXAMPLE 17

Structure of Whole Coating Layer

Using a cemented carbide with a shape of CNMG 120408 of ISO P30 (with a chip breaker) as a substrate, coating layers each having the structure shown in Table 29 were formed on the surface thereof. In Samples of the present invention, the formation of the titanium nitride film of the first layer and the titanium carbonitride film of the second layer was carried out under the same conditions as those for forming the film in Samples of the present invention described in Example 16. In Sample 15, the titanium carbonitride film was directly formed on the substrate without inserting the undercoated titanium nitride in the similar manner to Sample E of Example 16. The formation of the titanium carbonitride film in the case of Sample 16 was carried out by the MT-CVD method using no Ar in the similar manner to Sample 7 of Example 16. The other films were formed by the heat-assisted CVD method of the prior art to obtain samples each having a film thickness and film structure as shown in Table 29.

TABLE 29

| | Thickness of Each Layer in Film Structure ($\mu$m) | | | | | | | | Whole Film | Second TiCN Film | |
|---|---|---|---|---|---|---|---|---|---|---|---|
| Sample No. | TiN at Sub. Side | TiCN | TiC | TiCN | TiBCN | TiBN | $Al_2O_3$ | TiC | TiN | Thickness ($\mu$m) | Grain Diameter ($\mu$m) | Hardness |
| 8  | 0.5 | 6.3 | 0   | 0   | 0.3 | 0   | 1.0 | 0   | 0.2 | 8.3 | 2.0 | 2130 |
| 9  | 0.9 | 4.4 | 0   | 0   | 0   | 0.6 | 3.1 | 0   | 0.3 | 9.3 | 1.2 | 1850 |
| 10 | 0.8 | 3.2 | 2.1 | 0   | 0.5 | 0   | 1.9 | 0   | 1.1 | 9.6 | 0.8 | 1930 |
| 11 | 0.5 | 2.9 | 2.3 | 0   | 0.4 | 0   | 1.3 | 0.2 | 0.2 | 7.8 | 0.7 | 1910 |
| 12 | 0.7 | 3.1 | 3.2 | 0   | 0   | 0.3 | 1.7 | 0.3 | 0.5 | 9.8 | 0.9 | 2110 |
| 13 | 0.6 | 4.7 | 0   | 1.0 | 0   | 0   | 2.1 | 0   | 0.4 | 8.8 | 1.3 | 1760 |
| 14 | 0.5 | 3.5 | 3.0 | 0   | 0   | 0   | 1.8 | 0   | 0.6 | 9.4 | 0.8 | 1830 |
| 15 | 0.0 | 5.2 | 0   | 0   | 0.5 | 0   | 1.9 | 0   | 0.4 | 8.0 | 1.7 | 2050 |
| 16 | 0.7 | 4.8 | 0   | 0   | 0.5 | 0   | 2.5 | 0   | 0.3 | 8.8 | 3.1 | 2540 |

(Note) Samples 15–16: Comparative Samples

Samples shown in Table 29 were subjected to a cutting test under cutting conditions shown in Table 30 to obtain results shown in Table 31.

It is apparent from Table 31 that Samples 8 to 14 are excellent in wear resistance as well as stripping resistance and respectively exhibit a stable service life.

When the titanium carbonitride film, as the undercoated intermediate layer, was not inserted (Sample 15), on the other hand, the etched layer was formed on the substrate surface, resulting in inferior stripping resistance, as was also confirmed in Example 16. In a case where the average grain diameter of the columnar crystals making up the titanium carbonitride film and the hardness of the film were not within the scope of the present invention (Sample 16), the film was liable to be broken to a large extent during cutting, thus resulting in breakage. Both of Samples 15 and 16 did not satisfy the wear resistance and stripping resistance and were inferior in performance as a cutting tool.

TABLE 30

| Items | Cutting Conditions 22 | Cutting Conditions 23 |
|---|---|---|
| Workingpiece | SCM 435 | SCM 415 |
| Cutting Speed (m/min) | 140 | 250 |
| Feed (min/rev) | 0.35 | 0.3 |
| Cutting Depth (mm) | 1.5 | 1.5 |
| Cutting Oil | no (dry) | water-soluble |
| Cutting Time | 30 min. | 1 pass = 10 sec., repeated 1000 times |

TABLE 31

|  | Cutting Conditions 22 | | Cutting Conditions 23 | |
| --- | --- | --- | --- | --- |
| Sample No. | Average Flank Wear Width (min) | Presence of Stripping | Average Flank Wear Width (min) | Presence of Stripping |
| 8 | 0.21 | no | 0.15 | no |
| 9 | 0.22 | yes | 0.16 | no |
| 10 | 0.20 | no | 0.14 | no |
| 11 | 0.18 | no | 0.13 | no |
| 12 | 0.19 | no | 0.14 | no |
| 13 | 0.16 | no | 0.12 | no |
| 14 | 0.20 | no | 0.16 | no |
| 15 | 0.27 | yes | 0.29 | yes |
| 16 | 0.30 | yes (broken) | 0.20 | no |

EXAMPLE 18

Using a titanium boronitride-based cermet with a shape of CNMG 120408 of ISO P30 as a substrate, coating layers each having the structure shown in Table 32 were formed on the surface thereof. In Samples of the present invention, the formation of the titanium nitride film of the first layer and the titanium carbonitride film of the second layer was carried out under the same conditions as those for forming the film in Samples of the present invention described in Example 16. In Sample 21, the titanium carbonitride film was directly formed on the substrate without inserting the undercoated titanium nitride in the similar manner to Sample 6 of Example 16. The formation of the titanium carbonitride film in the case of Sample 22 was carried out by the MT-CVD method using no Ar in the similar manner to Sample 7 of Example 16. The other films were formed by the heat-assisted CVD method of the prior art to obtain samples each having a film thickness and film structure as shown in Table 32.

TABLE 32

| | Thickness of Each Layer in Film Structure ($\mu$m) | | | | | | | | | Whole Film | Second TiCN Film | |
| --- | --- | --- | --- | --- | --- | --- | --- | --- | --- | --- | --- | --- |
| Sample No. | TiN at Sub. Side | TiCN | TiC | TiCN | TiBCN | TiBN | Al$_2$O$_3$ | TiC | TiN | Thickness ($\mu$m) | Grain Diameter ($\mu$m) | Hardness |
| 17 | 0.5 | 4.2 | 0 | 0 | 0.4 | 0 | 1.4 | 0 | 0.3 | 6.8 | 1.3 | 1910 |
| 18 | 1.4 | 1.7 | 1.3 | 0 | 0 | 0.4 | 1.2 | 0 | 0.7 | 6.7 | 0.6 | 1890 |
| 19 | 0.3 | 2.0 | 1.5 | 0.5 | 0.5 | 0 | 1.4 | 0 | 0.4 | 6.6 | 0.7 | 2010 |
| 20 | 0.5 | 4.5 | 0 | 0 | 0 | 0.5 | 1.1 | 0.3 | 0.2 | 7.1 | 1.4 | 2100 |
| 21 | 0 | 4.3 | 0 | 0 | 0.4 | 0 | 1.3 | 0 | 0.4 | 6.4 | 1.6 | 2030 |
| 22 | 0.4 | 4.2 | 0 | 0 | 0.4 | 0 | 1.4 | 0 | 0.3 | 6.7 | 3.1 | 2510 |

(Note)
Samples 21–22: Comparative Samples

Samples shown in Table 32 were subjected to a cutting test under cutting conditions shown in Table 33 to obtain results shown in Table 34.

It is apparent from Table 34 that Samples 17 to 20 are excellent in wear resistance as well as stripping resistance and respectively exhibit a stable service life.

When the titanium carbonitride film, as the undercoated intermediate layer, was not inserted (Sample 21), on the other hand, the etched layer was formed on the substrate surface, resulting in inferior stripping resistance, as was also confirmed in Example 16. In a case where the average grain diameter of the columnar crystals making up the titanium carbonitride film and the hardness of the film were not within the scope of the present invention (Sample 22), the film was liable to be broken to a large extent during cutting, thus resulting in breakage. Both of Samples 21 and 22 did not satisfy the wear resistance and stripping resistance and were inferior in performance as a cutting tool.

TABLE 33

| Items | Cutting Conditions 24 |
| --- | --- |
| Workingpiece | SCM 415 |
| Cutting Speed (m/min) | 250 |
| Feed (mm/rev) | 0.3 |
| Cutting Depth (mm) | 1.5 |
| Cutting Oil | no |
| Cutting Time | 20 minutes |

TABLE 34

| | Cutting Conditions 24 | |
| --- | --- | --- |
| Sample No. | Average Flank Wear Width (mm) | Presence or Absence of Stripping |
| 17 | 0.16 | no |
| 18 | 0.17 | no |
| 19 | 0.15 | no |
| 20 | 0.17 | no |
| 21 | 0.26 | yes |
| 22 | 0.30 | yes (broken) |

Utility and Possibility on Commercial Scale

The coated cutting tool of the present invention, having a higher wear resistance of the coating film itself, more tenacious adhesiveness of the coating film and substrate and more excellent stripping resistance than the coated cutting tool of the prior art, is available for a working needing the wear resistance of a coating layer at a high temperature, such as high speed cutting working, and a working needing a number of workings and a number of thrusting-in workpieces, such as working of small-sized parts.

We claim:

1. A coated cutting tool comprising coating layers of an inner layer and an outer layer on a surface of a substrate selected from the group consisting of a tungsten carbide-based cemented carbide, a titanium carbonitride-based cermet, silicon nitride-based ceramics and aluminum oxide-based ceramics; the inner layer being a double layer of titanium nitride of 0.1 to 2 μm in thickness, in contact with the substrate and titanium carbonitride directly above it, and a multi-layer consisting of at least one coating selected from the group consisting of carbides, nitrides, carbonitrides, boronitrides and borocarbonitrides of titanium on the said double layer, and wherein the outer layer is a mono-layer or multi-layer, each consisting of at least one member selected from the group consisting of aluminum oxide, zirconium oxide, hafnium oxide, titanium carbide, titanium carbonitride and titanium nitride, characterized in that the chlorine content in the above described inner layer is at most 0.05 atom % on average throughout the inner layer, said coated cutting tool being further characterized in that the thickness of titanium carbonitride directly above the titanium nitride of 0.1 to 2 μm in thickness, in contact with the substrate, in the inner layer, is 1 to 20 μm and the total film thickness of the inner and outer layer is 2 to 100 μm, and wherein the total film thickness of both the titanium nitride layer and the titanium carbonitride layer is in a proportion of at least 46%, based upon the total thickness of the inner layer.

2. The coated cutting tool, as claimed in claim 1, characterized in that the chlorine content on average of titanium nitride of 0.1 to 2 μm in thickness, in contact with the substrate, and titanium carbonitride directly above it, in the above described inner layer, is at most 0.05 atom %.

3. The coated cutting tool, as claimed in claim 1 or 2, characterized in that the titanium carbonitride directly above the titanium nitride of 0.1 to 2 μm in thickness, in contact with the substrate, in the above described inner layer, of planes having diffraction peaks appeared between X-ray diffraction angles 2θ=20°–140°, I (hkl)/I (220), ratio of the sum I of the diffraction peak intensities of plane (hkl) having an interplanar spacing of 30°–60° with (220) plane to the peak intensity I (220), of (220) plane satisfies the following relationship;

on average of from the substrate surface or titanum nitride surface to 0–3 μm:

$$2.5 \leq I\ (hkl)/I\ (220) \leq 7.0$$

on average of from the substrate surface or titanum nitride surface to 0–20 μm:

$$2.5 \leq I\ (hkl)/I\ (220) \leq 15.0.$$

4. A coated cutting tool comprising coating layers of an inner layer and an outer layer on a surface of a substrate selected from the group consisting of a tungsten carbide-based cemented carbide, a titanium carbonitride-based cermet, silicon nitride-based ceramics and aluminum oxide-based ceramics; the inner layer being selected from the group consisting of a double layer of titanium nitride of 0.1 to 2 μm in thickness, in contact with the substrate and titanium carbonitride directly above it, and a multi-layer consisting of at least one coating selected from the group consisting of carbides, nitrides, carbonitrides, boronitrides and borocarbonitrides of titanium on said double layer, and wherein the outer layer is a mono-layer or multi-layer, each consisting of at least one member selected from the group consisting of aluminum oxide, zirconium oxide, hafnium oxide, titanium carbide, titanium carbonitride and titanium nitride, characterized in that when diffractions of the titanium carbonitride directly above the titanium nitride of 0.1 to 2 μm in thickness, in contact with the substrate are taken, of planes having diffraction peaks appearing between X-ray diffraction angles 2 θ=20°–140° C., I (hkl)/I (220), a ratio of the sum I of the diffraction peak intensities of plane (hkl) having an interplanar spacing of 30°–60° with (220) plane to the peak intensity 1 (220) of (220) plane satisfies the following relationship;

on average of from the substrate surface or titanium nitride surface to 0–3 μm:

$$2.5 \leq I\ (hkl)/I\ (220) \leq 7.0$$

on average of from the substrate surface or titanium nitride surface to 0–20 μm:

$$2.5 \leq I\ (hkl)/I\ (220) \leq 15.0,$$

said coated, cutting tool being further characterized in that the thickness of the titanium carbonitride directly above the titanium nitride of 0.1 to 2 μm in thickness, in contact with the substrate, in the inner layer, is 1 to 20 μm and the total film thickness of the inner and outer layer is 2 to 100 μm, and wherein the total film thickness of both the titanium nitride layer and the titanium carbonitride layer is in a proportion of at least 46%, based upon the total thickness of the inner layer.

5. The coated cutting tool, as claimed in any one of claims 1, 2 and 4, characterized in that when in X-ray diffractions of the titanium carbonitride directly above the titanium nitride of 0.1 to 2 μm in thickness, in contact with the substrate, in the above described inner layer, the peak intensity of (311) plane is I (311) and the peak intensity of (220) plane is I (220), the value of I (311)/I (220) satisfies the following relationship;

on average of from the substrate surface or titanum nitride surface to 0–3 μm:

$$0.5 \leq I\ (311)/I\ (220) \leq 1.5$$

on average of from the substrate surface or titanum nitride surface to 0–20 μm:

$$0.5 \leq I\ (311)/I\ (220) \leq 6.0.$$

6. The coated cutting tool, as claimed in any one of claims 1, 2 and 4, characterized in that when in X-ray diffractions of titanium carbonitride directly above the titanium nitride of 0.1 to 2 μm in thickness, in contact with the substrate, in the above described inner layer, the peak intensity of (111)

plane is I (111) and the peak intensity of (220) plane is I (220), the value of I (111)/I (220) satisfies the following relationship;

on average of from the substrate surface or titanium nitride surface to 0–3 μm:

$$1.0 \leq I\ (111)/I\ (220) \leq 4.0$$

on average of from the substrate surface or titanium nitride surface to 0–20 μm:

$$1.0 \leq I\ (111)/I\ (220) \leq 8.0.$$

7. The coated cutting tool, as claimed in any one of claims 1, 2 and 4, characterized in that when in X-ray diffractions of the titanium carbonitride directly above the titanium nitride of 0.1 to 2 μm in thickness, in contact with the substrate, in the above described inner layer, the peak intensity of (311) plane is I (311), the peak intensity of (111) plane is I (1111 and the peak intensity of (220) plane is I (220), the value of [I (111)+I (311)]/I(220) satisfies the following relationship;

on average of from the substrate surface or titanium nitride surface to 0–3 μm:

$$2.0 \leq [I\ (111)+I\ (311)]/I\ (220) \leq 5.5$$

on average of from the substrate surface or titanium nitride surface to 0–20 μm:

$$2.0 \leq [I\ (111)+I\ (311)]/I\ (220) \leq 14.0.$$

8. The coated cutting tool, as claimed in claim 7, characterized in that the above described substrate consists of a tungsten carbide-based cemented carbide or titanium carbonitride-based cermet and the thickness of η phase on the outermost surface at the boundary between the coating layer and substrate in the vicinity of the cutting edge ridge line is at most 1 μm.

9. A coated cutting tool comprising coating layers of an inner layer and an outer layer on a surface of a substrate selected from the group consisting of a tungsten carbide-based cemented carbide, a titanium carbonitride-based cermet, silicon nitride-based ceramics and aluminum oxide-based ceramics; the inner layer being selected from the group consisting of a double layer of titanium nitride of 0.1 to 2 μm in thickness, in contact with the substrate and titanium carbonitride directly above it, and a multi-layer consisting of at least one coating selected from the group consisting of carbides, nitrides, carbonitrides, boronitrides and borocarbonitrides of titanium on said double layer, and wherein the outer layer is a mono-layer or multi-layer, each consisting of at least one member selected from the group consisting of aluminum oxide, zirconium oxide, hafnium oxide, titanium carbide, titanium carbonitride and titanium nitride, characterized in that when X-ray diffractions of the titanium carbonitride directly above the titanium nitride of 0.1 to 2 μm in thickness, in contact with the substrate are measured, the peak intensity of (311) plane is I (311) and the peak intensity of (220) plane is I (220), and the value of I (311)/I (220) satisfies the following relationship;

on average of from the substrate surface or titanium nitride surface to 0–3 μm:

$$0.5 \leq I\ (311)/I\ (220) \leq 1.5$$

on average of from the substrate surface or titanium nitride surface to 0–20 μm:

$$0.5 \leq I\ (311)/I\ (220) \leq 6.0,$$

said coated cutting tool being further characterized in that the thickness of the titanium carbonitride directly above the titanium nitride of 0.1 to 2 μm in thickness, in contact with the substrate, in the inner layer, is 1 to 20 μm and the total film thickness of the inner and outer layer is 2 to 100 μm, and wherein the total film thickness of both the titanium nitride layer and the titanium carbonitride layer is in a proportion of at least 46%, based upon the total thickness of the inner layer.

10. A coated cutting tool comprising coating layers of an inner layer and an outer layer on a surface of a substrate selected from the group consisting of a Tungsten carbide-based cemented carbide, a titanium carbonitride-based cermet, silicon nitride-based ceramics and aluminum oxide-based ceramics; the inner layer being selected from the group consisting of a double layer of titanium nitride of 0.1 to 2 μm in thickness, in contact with the substrate and titanium carbonitride directly above it, and a multi-layer consisting of at least one coating selected from the group consisting of carbides, nitrides, carbonitrides, boronitrides and borocarbonitrides of titanium on said double layer, and wherein the outer layer is a mono-layer or multi-layer, each consisting of at least one member selected from the group consisting of aluminum oxide, zirconium oxide, hafnium oxide, titanium carbide, titanium carbonitride and titanium nitride, characterized in that when X-ray diffractions of the titanium carbonitride directly above the titanium nitride of 0.1 to 2 μm in thickness, in contact with the substrate are measured, the peak intensity of (111) plane is I (111) and the peak intensity of (220) plane is I (220), and the value of I (111)/I (220) satisfies the following relationship;

on average of from the substrate surface or titanium nitride surface to 0–3 μm:

$$1.0 \leq I\ (111)/I\ (220) \leq 4.0$$

on average of from the substrate surface or titanium nitride surface to 0–20 μm:

$$1.0 \leq I\ (111)/I\ (220) \leq 8.0,$$

said coated cutting tool being further characterized in that the thickness of the titanium carbonitride directly above the titanium nitride of 0. 1 to 2 μm in thickness, in contact with the substrate, in the inner layer, is 1 to 20 μm and the total film thickness of the inner and outer layer is 2 to 100 μm, and wherein the total film thickness of both the titanium nitride layer and the titanium carbonitride layer is in a proportion of at least 46%, based upon the total thickness of the inner layer.

11. A coated cutting tool comprising coating layers of an inner layer and an outer layer on a surface of a substrate selected from the group consisting of a tungsten carbide-based cemented carbide, a titanium carbonitride-based cermet, silicon nitride-based ceramics and aluminum oxide-based ceramics; the inner layer being selected from the group consisting of a double layer of titanium nitride of 0.1 to 2 μm in thickness, in contact with the substrate and titanium carbonitride directly above it, and a multi-layer consisting of at least one coating selected from the group consisting of carbides, nitrides, carbonitrides, boronitrides and borocarbonitrides of titanium on said double layer, and wherein the outer layer is a mono-layer or multi-layer, each consisting of at least one member selected from the group consisting of aluminum oxide, zirconium oxide, hafnium oxide, titanium carbide, titanium carbonitride and titanium nitride, characterized in that when X-ray diffractions are taken of the titanium carbonitride directly above the titanium nitride of 0.1 to 2 μm in thickness, in contact with the substrate, the peak intensity of (311) plane is I (311) and the peak intensity of (111) plane is I (111) and the peak intensity of (220) plane is I (220), and the value of (I (111)+I (311))/I (220) satisfies the following relationship;

on average of from the substrate surface or titanium nitride surface to 0–3 μm:

$$2.0 \leq (I\ (111) + I\ (311))/I\ (220) \leq 5.5$$

on average of from the substrate surface or titanium nitride surface to 0–20 μm:

$$2.0 \leq (I\ (111) + I\ (311))/I\ (220) \leq 14.0,$$

said coated cutting tool being further characterized in that the thickness of the titanium carbonitride directly above the titanium nitride of 0.1 to 2 μm in thickness, in contact with the substrate, in the inner layer, is 1 to 20 μm and the total film thickness of the inner and outer layer is 2 to 100 μm, and wherein the total film thickness of both the titanium nitride layer and the titanium carbonitride layer is in a proportion of at least 46%, based upon the total thickness of the inner layer.

* * * * *